US010084427B2

United States Patent
Solal et al.

(10) Patent No.: US 10,084,427 B2
(45) Date of Patent: Sep. 25, 2018

(54) SURFACE ACOUSTIC WAVE DEVICE HAVING A PIEZOELECTRIC LAYER ON A QUARTZ SUBSTRATE AND METHODS OF MANUFACTURING THEREOF

(71) Applicant: TriQuint Semiconductor, Inc., Hillsboro, OR (US)

(72) Inventors: Marc Solal, Longwood, FL (US); Shogo Inoue, Longwood, FL (US)

(73) Assignee: Qorvo US, Inc., Greensboro, NC (US)

( * ) Notice: Subject to any disclaimer, the term of this patent is extended or adjusted under 35 U.S.C. 154(b) by 131 days.

(21) Appl. No.: 15/086,895

(22) Filed: Mar. 31, 2016

(65) Prior Publication Data
US 2017/0222622 A1    Aug. 3, 2017

Related U.S. Application Data

(60) Provisional application No. 62/288,018, filed on Jan. 28, 2016.

(51) Int. Cl.
*H03H 9/02* (2006.01)
*H03H 9/64* (2006.01)
(Continued)

(52) U.S. Cl.
CPC ........ *H03H 9/02574* (2013.01); *H03H 3/007* (2013.01); *H03H 9/02551* (2013.01); *H03H 9/562* (2013.01); *H03H 9/64* (2013.01)

(58) Field of Classification Search
CPC ...... H03H 3/007; H03H 3/08; H03H 9/02551; H03H 9/02574; H03H 9/562; H03H 9/64
(Continued)

(56) References Cited

U.S. PATENT DOCUMENTS

| 4,600,853 A | 7/1986 | Whitlock et al. |
| 5,441,900 A | 8/1995 | Bulucea et al. |

(Continued)

FOREIGN PATENT DOCUMENTS

| FR | 2788176 A1 | 7/2000 |
| JP | 2007028538 A | 2/2007 |

(Continued)

OTHER PUBLICATIONS

Chen, Jing et al., "Suppression Rayleigh Wave Spurious Signal in SH-SAW Devices Employing PMN-33%PT crystals," Proceedings of Symposium on Ultrasonic Electronics, vol. 31, Issue 2010, Dec. 6-8, 2010, pp. 287-288.

(Continued)

*Primary Examiner* — Robert J Pascal
*Assistant Examiner* — Jorge Salazar, Jr.
(74) *Attorney, Agent, or Firm* — Withrow & Terranova, P.L.L.C.

(57) ABSTRACT

Embodiments of a Surface Acoustic Wave (SAW) device and methods of fabrication thereof are disclosed. In some embodiments, a SAW device includes a quartz carrier substrate, a piezoelectric layer on a surface of the quartz carrier substrate, and at least one interdigitated transducer on a surface of the piezoelectric layer opposite the quartz carrier substrate, wherein a thickness of the piezoelectric layer is less than twice a transducer electrode period of the at least one interdigitated transducer. Using the piezoelectric layer on the carrier substrate suppresses acoustic radiation into the bulk, thereby improving the performance of the SAW device. Further, by utilizing quartz for the carrier substrate, additional advantages of small viscous losses, small permittivity, and small thermal sensitivity are achieved. Still further, as compared to Silicon, the use of quartz for the carrier substrate eliminates resistive losses.

25 Claims, 25 Drawing Sheets

(51) Int. Cl.
*H03H 3/007* (2006.01)
*H03H 9/56* (2006.01)

(58) Field of Classification Search
USPC .............. 333/133, 193–196; 310/313 A, 361
See application file for complete search history.

(56) References Cited

U.S. PATENT DOCUMENTS

| | | | |
|---|---|---|---|
| 5,475,348 A | | 12/1995 | Hode et al. |
| 5,719,538 A | * | 2/1998 | Kadota .............. H03H 9/02551 310/313 A |
| 6,344,705 B1 | | 2/2002 | Solal et al. |
| 6,445,265 B1 | | 9/2002 | Wright |
| 7,105,980 B2 | | 9/2006 | Abbott et al. |
| 7,411,333 B2 | | 8/2008 | Kihara et al. |
| 8,035,464 B1 | | 10/2011 | Abbott et al. |
| 8,115,365 B2 | | 2/2012 | Suzuki et al. |
| 8,456,257 B1 | | 6/2013 | Fattinger |
| 9,319,023 B2 | | 4/2016 | Tanaka |
| 9,438,201 B2 | * | 9/2016 | Hori .................... H03H 9/02228 |
| 9,503,049 B2 | | 11/2016 | Nishii et al. |
| 2007/0296306 A1 | | 12/2007 | Hauser et al. |
| 2009/0096046 A1 | | 4/2009 | Heringa et al. |
| 2010/0141086 A1 | | 6/2010 | Suzuki et al. |
| 2010/0289379 A1 | | 11/2010 | Owaki et al. |
| 2012/0032759 A1 | * | 2/2012 | Nishii ...................... H03H 3/08 333/193 |
| 2013/0049533 A1 | | 2/2013 | Viatsuda et al. |
| 2013/0207747 A1 | | 8/2013 | Nishii et al. |
| 2013/0285768 A1 | * | 10/2013 | Watanabe ............ H03H 9/0222 333/193 |
| 2014/0145557 A1 | | 5/2014 | Tanaka |
| 2014/0167565 A1 | | 6/2014 | Iwamoto |
| 2014/0210317 A1 | | 7/2014 | Tai et al. |
| 2017/0033756 A1 | | 2/2017 | Inoue et al. |
| 2017/0033764 A1 | | 2/2017 | Inoue et al. |

FOREIGN PATENT DOCUMENTS

| | | |
|---|---|---|
| JP | 201573331 A | 4/2015 |
| JP | 5713025 B2 | 5/2015 |

OTHER PUBLICATIONS

International Search Report and Written Opinion for International Patent Application No. PCT/US2017/014806, dated Apr. 21, 2017, 12 pages.
International Search Report and Written Opinion for International Patent Application No. PCT/US2017/014808, dated Apr. 19, 2017, 9 pages.
Author Unknown, "What is SAW Filters: Advantage of Token Piezoelectric SAW Devices," Token, Version 2010, 5 pages.
Emam, Mostafa, "RF SOI: from Material to ICs—an Innovative Characterization Approach," FD-SOI and RF-SOI-Forum, Feb. 27, 2015, 35 pages.
Gong, Songbin et al., "Overmoded Shear Horizontal Wave MEMS Resonators using X-Cut Lithium Niobate Thin Film," 2014 IEEE International Ultrasonics Symposium (IUS), Sep. 3-6, 2014, pp. 568-571.
Miura, M. et al., "Temperature Compensated LiTaO3/Sapphire Bonded SAW Substrate with low Loss and High Coupling Factor Suitable for US-PCS Application," 2004 IEEE Ultrasonics Symposium, vol. 2, Aug. 23-27, 2004, pp. 1322-1325.
Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.
Reinhardt, Alexandre et al., "Acoustic filters based on thin single crystal LiNbO$_3$ films: Status and prospects," 2014 IEEE International Ultrasonics Symposium (IUS), Sep. 3-6, 2014, pp. 773-781.
Solal, M. et al., "Oriented lithium niobate layers transferred on 4" (100) silicon wafer for RF SAW devices, Proceedings of the 2002 IEEE Ultrasonics Symposium, vol. 1, Oct. 2002, IEEE, pp. 131-134.
Author Unknown, "Working principles and Applications of SAW/FBAR Devices," TaiyoYuden, Navigator, Section 2, Aug. 11, 2014, pp. 10-15.
Malocha, Donald C., "Surface Acoustic Wave Technology and Wireless Applications," Presentation at the University of South Florida, Nov. 14, 2001, 145 pages.
Notice of Allowance for U.S. Appl. No. 15/086,936, dated Jul. 9, 2018, 8 pages.
Non-Final Office Action for U.S. Appl. No. 15/087,225, dated Jun. 21, 2018, 5 pages.
Non-Final Office Action for U.S. Appl. No. 15/087,423, dated Jul. 31, 2018, 17 pages.

* cited by examiner

SURFACE ACOUSTIC WAVE DEVICE HAVING A PIEZOELECTRIC LAYER ON A QUARTZ SUBSTRATE AND METHODS OF MANUFACTURING THEREOF

RELATED APPLICATIONS

This application claims the benefit of provisional patent application Ser. No. 62/288,018, filed Jan. 28, 2016, the disclosure of which is hereby incorporated herein by reference in its entirety.

This application is related to:

U.S. patent application Ser. No. 15/087,225, entitled BONDED WAFERS AND SURFACE ACOUSTIC WAVE DEVICES USING SAME, which was filed Mar. 31, 2016;

U.S. patent application Ser. No 15/087,423, entitled METHODS FOR FABRICATION OF BONDED WAFERS AND SURFACE ACOUSTIC WAVE DEVICES USING SAME, which was filed Mar. 31, 2016; and U.S. patent application Ser. No 15/086,936, entitled GUIDED SURFACE ACOUSTIC WAVE DEVICE PROVIDING SPURIOUS MODE REJECTION, which was filed Mar. 31, 2016;

all of which are commonly owned and assigned and are hereby incorporated herein by reference in their entireties.

FIELD OF THE DISCLOSURE

The present disclosure relates to a Surface Acoustic Wave (SAW) device.

BACKGROUND

Surface Acoustic Wave (SAW) devices, such as SAW resonators and SAW filters, are used in many applications such as Radio Frequency (RF) filters. For example, SAW filters are commonly used in Second Generation (2G), Third Generation (3G), and Fourth Generation (4G) wireless receiver front ends, duplexers, and receive filters. The widespread use of SAW filters is due to, at least in part, that fact that SAW filters exhibit low insertion loss with good rejection, can achieve broad bandwidths, and are a small fraction of the size of traditional cavity and ceramic filters. As with any electronic device, the performance of a SAW device is an important parameter that can impact the overall performance of a system. In this regard, there is a need for a high performance SAW device.

SUMMARY

Embodiments of a Surface Acoustic Wave (SAW) device and methods of fabrication thereof are disclosed. In some embodiments, a SAW device includes a quartz carrier substrate, a piezoelectric layer on a surface of the quartz carrier substrate, and at least one interdigitated transducer on a surface of the piezoelectric layer opposite the quartz carrier substrate. Notably, as used herein, "quartz" is single crystal quartz as opposed to fused silica (sometimes referred to as fused silica quartz), which is amorphous. In some embodiments, a thickness of the piezoelectric layer is less than four times a transducer electrode period of the at least one interdigitated transducer. In other embodiments, the thickness of the piezoelectric layer is less than twice the transducer electrode period of the at least one interdigitated transducer. Using the piezoelectric layer on the carrier substrate suppresses acoustic radiation into the bulk (i.e., the substrate), thereby improving the performance of the SAW device. Further, by utilizing quartz for the carrier substrate, additional advantages of small viscous losses, small permittivity, and small thermal sensitivity are achieved. Still further, as compared to Silicon, the use of quartz for the carrier substrate eliminates resistive losses.

In some embodiments, a propagation direction of the at least one interdigitated transducer forms an angle less than 10 degrees with a z-axis or −z-axis of a quartz crystal of the quartz carrier substrate. Further, in some embodiments, the piezoelectric layer is formed of Lithium Tantalate ($LiTaO_3$) (sometimes referred to herein as "LT") with an orientation between Y and Y+60 degrees and a propagation along the x-axis of the LT crystal, which is possible by, e.g., bonding to align the x-axis of the LT crystal with the z-axis of the quartz crystal. Still further, in some embodiments, the thickness of the piezoelectric layer is less than 60% of the transducer electrode period of the at least one interdigitated transducer.

In some embodiments, a normal of the quartz carrier substrate is oriented along an x-axis or y-axis of the quartz crystal of the quartz carrier substrate. Further, in some embodiments, the thickness of the piezoelectric layer is between 30% and 50% of the transducer electrode period of the at least one interdigitated transducer.

In other embodiments, a normal of the quartz carrier substrate forms an angle between 30 and 55 degrees with an x-axis of the quartz crystal of the quartz carrier substrate. Further, in some embodiments, the thickness of the piezoelectric layer is between 20% and 40% of the transducer electrode period of the at least one interdigitated transducer.

In some embodiments, the piezoelectric layer is formed of LT with an orientation between Y and Y+60 degrees. In other embodiments, the piezoelectric layer is formed of Lithium Niobate ($LiNbO_3$) with an orientation between Y−20 degrees and Y+60 degrees.

In some embodiments, the SAW device further includes one or more additional layers on the surface of the quartz carrier substrate between the quartz carrier substrate and the piezoelectric layer. Further, in some embodiments, the one or more additional layers comprise one or more dielectric layers. In some embodiments, the one or more dielectric layers include at least one layer of Silicon Oxide.

In some embodiments, the at least one interdigitated transducer is embedded inside one or more dielectric layers. In some embodiments, the one or more dielectric layers comprise Silicon Oxide.

In some embodiments, the SAW device further includes one or more dielectric layers on the surface of the at least one interdigitated transducer opposite the piezoelectric layer.

In some embodiments, the SAW device further includes at least one layer of Silicon Oxide on the surface of the quartz carrier substrate between the quartz carrier substrate and the piezoelectric layer, wherein the at least one layer of Silicon Oxide is doped to reduce its thermal sensitivity. In some embodiments, the at least one layer of Silicon Oxide is doped with a dopant containing Fluoride or Boron atoms.

In some embodiments, the SAW device is a SAW resonator.

Embodiments of filtering circuitry are also disclosed. In general, the filtering circuitry includes one or more SAW filters according to any of the embodiments above.

In some embodiments, filtering circuitry includes a SAW resonator that includes a quartz carrier substrate, a piezoelectric layer on a surface of the quartz carrier substrate, and at least one interdigitated transducer on a surface of the piezoelectric layer opposite the quartz carrier substrate. In some embodiments, a thickness of the piezoelectric layer is less than four times a transducer electrode period of the at least one interdigitated transducer. In other embodiments, the thickness of the piezoelectric layer is less than twice the transducer electrode period of the at least one interdigitated transducer.

In some embodiments, the filtering circuitry includes a ladder filter that includes multiple SAW resonators each including a quartz carrier substrate, a piezoelectric layer on a surface of the quartz carrier substrate, and at least one interdigitated transducer on a surface of the piezoelectric layer opposite the quartz carrier substrate. In some embodiments, a thickness of the piezoelectric layer is less than four times a transducer electrode period of the at least one interdigitated transducer. In other embodiments, the thickness of the piezoelectric layer is less than twice the transducer electrode period of the at least one interdigitated transducer.

In some embodiments, the filtering circuitry includes a Coupled Resonator Filter (CRF) that includes multiple SAW resonators each including a quartz carrier substrate that are formed by associating multiple transducers between two gratings, a piezoelectric layer on a surface of the quartz carrier substrate, and at least one interdigitated transducer on a surface of the piezoelectric layer opposite the quartz carrier substrate. In some embodiments, a thickness of the piezoelectric layer is less than four times a transducer electrode period of the at least one interdigitated transducer. In other embodiments, the thickness of the piezoelectric layer is less than twice the transducer electrode period of the at least one interdigitated transducer. In some embodiments, the filtering circuitry further includes a cascade of at least one CRF, including the CRF, and at least one additional SAW resonator connected in series or in parallel.

Embodiments of a method of fabricating a SAW device are also disclosed. In some embodiments, a method of fabricating a SAW device includes providing a quartz carrier substrate, providing a piezoelectric layer on a surface of the quartz carrier substrate, and providing at least one interdigitated transducer on a surface of the piezoelectric layer opposite the quartz carrier substrate. In some embodiments, a thickness of the piezoelectric layer is less than four times a transducer electrode period of the at least one interdigitated transducer. In other embodiments, the thickness of the piezoelectric layer is less than twice the transducer electrode period of the at least one interdigitated transducer.

In some embodiments, providing the piezoelectric layer on the surface of the quartz carrier substrate includes attaching a piezoelectric material on the surface of the quartz carrier substrate, and processing the piezoelectric material to reduce a thickness of the piezoelectric material to a desired thickness of the piezoelectric layer to thereby provide the piezoelectric layer.

In some embodiments, providing the piezoelectric layer on the surface of the quartz carrier substrate includes performing ion implantation into a surface of a piezoelectric material to thereby form a damaged portion of the piezoelectric material, attaching the piezoelectric material on the surface of the quartz carrier substrate, and processing the piezoelectric material to remove the damaged portion of the piezoelectric material to thereby provide the piezoelectric layer.

In some embodiments, the method further includes providing one or more additional layers on the surface of the quartz carrier substrate between the quartz carrier substrate and the piezoelectric layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
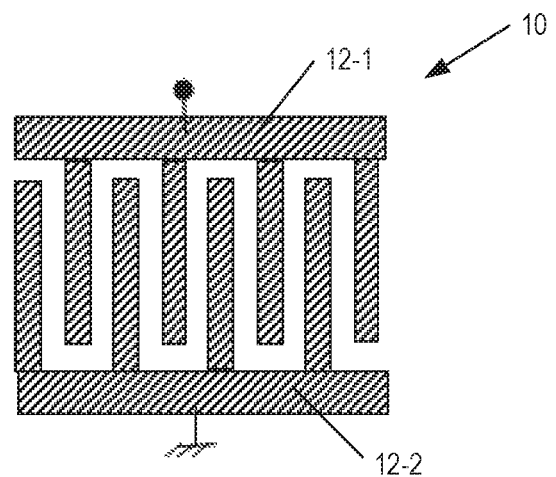
FIG. 1 is a diagram showing the principle of a Surface Acoustic Wave (SAW) interdigitated transducer.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

A major factor of loss for Radio Frequency (RF) Surface Acoustic Wave (SAW) devices using shear horizontal waves is acoustic radiation in the bulk substrate of the SAW device. A way to suppress this radiation is to use a piezoelectric film, or layer, laminated on a carrier substrate. The present disclosure relates to the use of quartz as the carrier substrate. Quartz presents the advantage of small viscous losses, small permittivity, and small thermal sensitivity. Also, compared with Silicon (Si), resistive losses in the substrate do not exist for quartz. In some embodiments, optimal orientations for the quartz wafer are disclosed.

Before describing embodiments of the present disclosure, a discussion of SAW devices and some associated problems is beneficial. SAW filters use the propagation of acoustic waves at the surface of a piezoelectric substrate. FIG. 1 shows one example of a SAW Interdigitated Transducer (IDT) 10. As illustrated, the IDT 10 includes two interdigitated electrodes 12-1 and 12-2 that are deposited on (e.g., directly on) the surface of a piezoelectric substrate (not shown). A voltage is applied between the two electrodes 12-1 and 12-2. This results in electrical fields between the two electrodes 12-1 and 12-2 and generation of SAWs by the piezoelectric effect. Due to the sequence of electrodes at alternate potentials, the fields for two consecutive periods are of opposite directions. This means that the IDT 10 has its maximum efficiency when the electrode period is half the acoustic wavelength.

Figure 2:
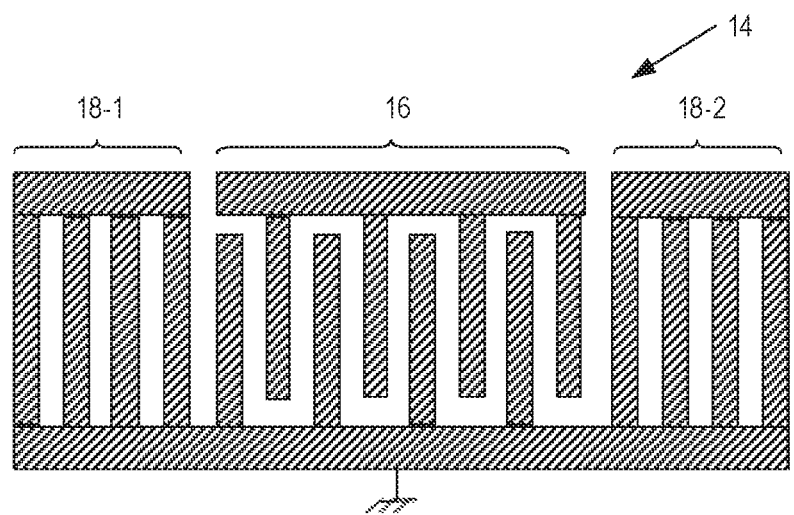
FIG. 2 is a diagram of a SAW resonator.

FIG. 2 shows one example of a SAW resonator 14. The SAW resonator 14 includes an IDT 16 inserted between two gratings 18-1 and 18-2, which are connected to ground in FIG. 2. The two gratings 18-1 and 18-2 act as reflectors and define an (acoustic) cavity.

Figure 3:
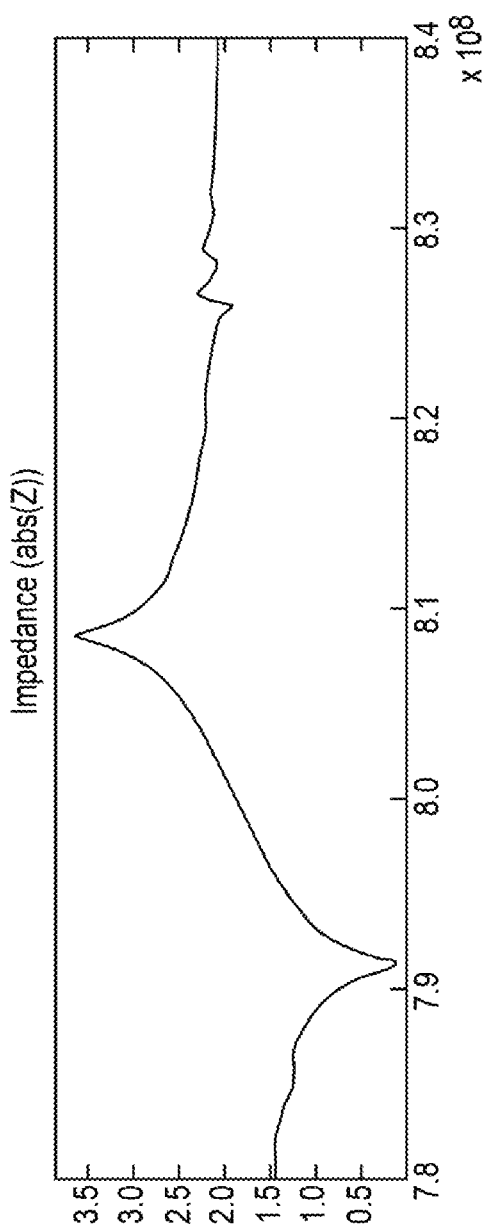
FIG. 3 is a plot showing an example of impedance (Z) for a SAW resonator.

FIG. 3 shows an example of resonator impedance (i.e., the impedance of one example of a SAW resonator such as, e.g., the SAW resonator 14 of FIG. 2). FIG. 3 is in log scale, i.e., it is not the abs(Z) which is plotted, but its log with some scaling factor. FIG. 3 is only for illustration. At resonance frequency, the impedance of the SAW resonator is close to zero and the SAW resonator acts as a short circuit. At the antiresonance frequency, the impedance of the SAW resonator is very large, and the SAW resonator acts as an open circuit. Using these properties, it is possible to design a ladder filter.

Figure 4:
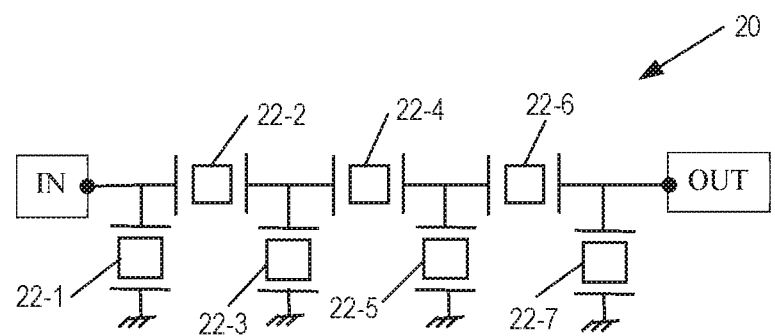
FIG. 4 is a schematic showing the principle of a ladder filter.

One example of a ladder filter 20 is illustrated in FIG. 4. As shown, several SAW resonators 22-1 through 22-7 are connected inside an electrical circuit. In general, the ladder filter 20 is designed such that the shunt resonators (i.e., the SAW resonators 22-1, 22-3, 22-5, and 22-7) have an antiresonance frequency close to the center frequency of the ladder filter 20. Also, the series resonators (i.e., the SAW resonators 22-2, 22-4, and 22-6 in the example of FIG. 4) are designed to have their resonance frequency close to the center frequency of the ladder filter 20. Thus, at the center frequency, the shunt resonators act as open circuits and the series resonators act as short circuits, and there is a direct connection between the input and the output of the ladder filter 20. At their resonance frequency, the shunt resonators act as short circuits, producing a notch in the transfer function of the ladder filter 20 below the passband. Similarly, at their antiresonance frequency, the series resonators act as open circuits and produce a notch above the stop band. Obviously, this is only a schematic explanation, and physical filters often have several different frequencies for the shunt resonators and antiresonance frequencies for the series resonators. Also, the design may include several lumped elements such as capacitance or inductances that shift the effective resonance frequencies of the resonators. Also, the filter shown in FIG. 4 is starting (at the input) and finishing (at the output) by shunt resonators. Obviously, this is only for illustration and series resonators can also be connected to the input and/or output.

Figure 5:
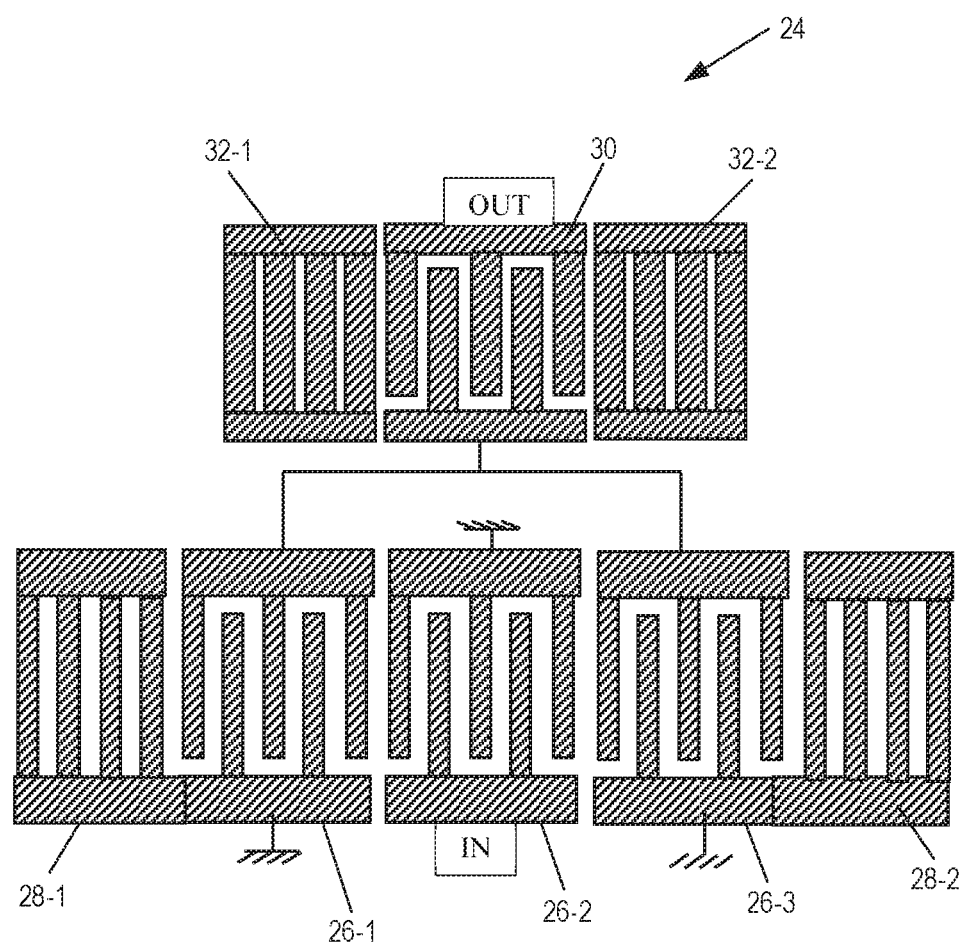
FIG. 5 is a diagram showing an example of a coupled resonator filter cascaded with a resonator.

In addition to ladder filters, it is possible to design so-called Coupled Resonator Filters (CRFs) or Double Mode SAW filters (DMSs). Instead of using SAW resonators as circuit elements, CRFs are designed by placing several transducers between two reflective gratings. In the example CRF 24 shown in FIG. 5, three IDTs 26-1 through 26-3 are placed between two reflectors 28-1 and 28-2. The center IDT 26-2 is connected to the input signal, whereas the two external IDTs 26-1 and 26-3 are connected in parallel. The cavity between the two reflectors 28-1 and 28-2 has several longitudinal modes. By choosing a symmetric arrangement of the IDTs 26-1 through 26-3, only the symmetric longitudinal modes are excited. This type of CRF normally uses mainly two longitudinal modes to couple the input IDT 26-2 to the output IDTs 26-1 and 26-3. The passband width is proportional to the frequency difference of these two modes. The coupling factor defines the possibility to electrically match the filter. As for ladder filters, a larger coupling factor allows a wider relative bandwidth. In the example of FIG. 5, the output IDTs 26-1 and 26-3 of the CRF stage are connected to a series resonator formed by, in this example, an IDT 30 and reflectors 32-1 and 32-2.

More generally, one or several CRF stages can be cascaded to one of several ladder elements. The ladder elements can be series or shunt resonators. Also, the number of transducers between the gratings can vary from two to a number as large as nine, for example. As it is well known, the space shifts between the transducers, their lengths, polarities, and periods have a large influence on the device performance Several parameters are important for a SAW resonator. One important parameter is the effective piezoelectric coupling factor, which depends on the ratio between antiresonance and resonance frequency. SAW resonators with larger coupling factors have larger frequency shifts between resonance and antiresonance and can be used to design wideband filters. The coupling factor mostly depends on the chosen piezoelectric substrate. Another important parameter of a SAW resonator is the resonator quality factor (Q), which influences the insertion losses of a filter designed with the SAW resonator and the steepness of the filter response. The quality factor (Q) depends mostly on the acoustic and electric losses in the SAW resonator.

Also, the resonance frequency of a SAW resonator is proportional to the velocity of the SAW. When the temperature changes, the velocity of the wave changes, and the filter shifts in frequency. Additionally, due to thermal expansion, the component dimensions change, leading also to an additional frequency shift. SAW filters need to be able to select a frequency band for a temperature range that is typically a range of 100° Celsius (C) or more. A large thermal sensitivity of a SAW filter results in a filter response shifting in frequency and overall in degraded performances inside a given temperature range. The thermal sensitivity is measured by a coefficient, which is typically referred to as the Thermal Coefficient of Frequency (TCF). Most materials have a negative TCF, meaning that the frequency decreases when the temperature increases.

The substrate choice for a SAW filter is critical for the performance of the device. It is common to use a substrate made of Lithium Tantalate (LiTaO$_3$), which is sometimes abbreviated as LT herein, with an orientation typically between Y+36 degrees and Y+50 degrees and a propagation along the x-axis of the LT crystal (i.e., the crystallographic x-axis of the LT). Note that an orientation Y+teta, propagation X means that the normal to the plane is the axis Y rotated by teta, where the rotation is done around the x-axis. On these substrates, the device is exciting primarily so-called leaky SAW or pseudo SAW or shear horizontal waves. The mechanical displacement associated with these waves is primarily in the direction parallel to the electrodes. The advantage of this type of wave is to produce a large electroacoustic coupling while keeping a relatively good temperature stability of the device frequency. Similarly, it is also possible to design a filter for a substrate of Lithium Niobate (LiNbO$_3$) with an orientation between Y−20 degrees and Y+60 degrees with a propagation along the x-axis. In this case, the same type of acoustic wave is excited. A large coupling coefficient can obtained.

When designing SAW devices exciting leaky SAWs, a well-known problem is the existence of propagation losses that, for SAW resonators, translate into a bad quality factor and, for SAW filters, translate into the impossibility of realizing steep frequency transition and high insertion losses. These propagation losses are due to the presence of a bulk mode at a velocity close to the velocity of the leaky SAWs. This results in acoustic energy radiation or scattering in the bulk.

Figure 6:
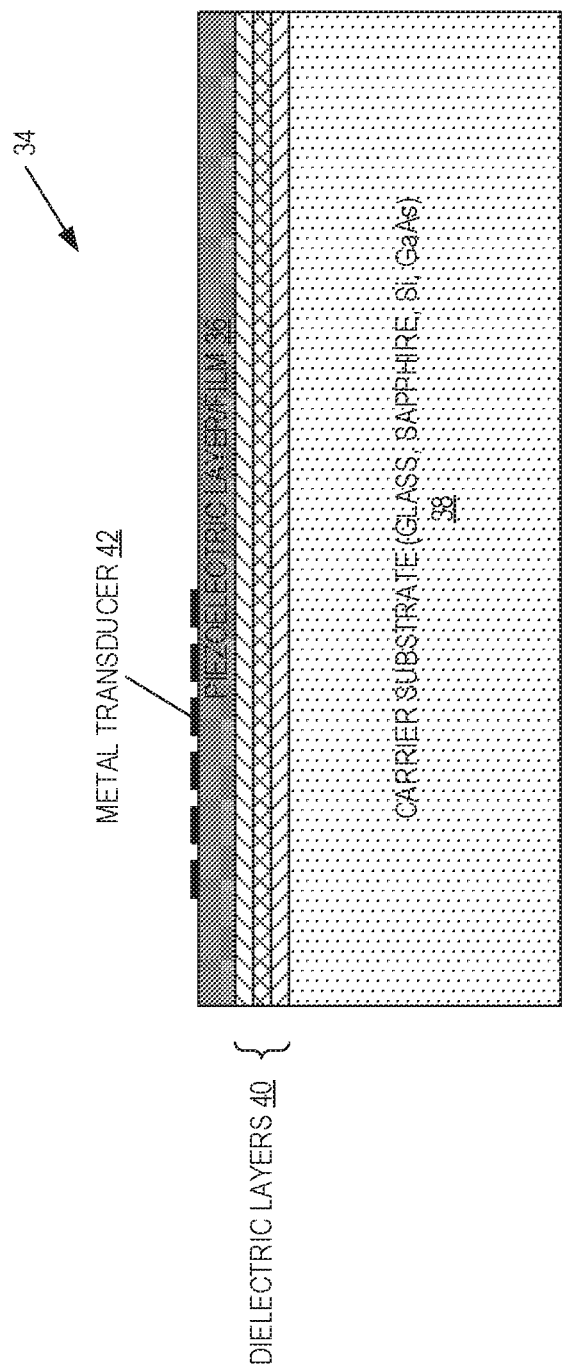
FIG. 6 is a diagram showing a SAW device using a carrier substrate, a piezoelectric film, and optionally dielectric layers.

A way to suppress this bulk radiation is to use a layered substrate where a layer of piezoelectric material, which is referred to herein as a piezoelectric layer, or film, is bonded or deposited on (e.g., directly on) the surface of a carrier substrate. One example of a SAW device 34 including a piezoelectric layer, or film, 36 bonded or deposited on a carrier substrate 38 is illustrated in FIG. 6. As illustrated, the SAW device 34 includes the carrier substrate 38, optionally one or more dielectric layers 40 on (e.g., directly on) the surface of the carrier substrate 38, the piezoelectric layer 36 on the surface of the one or more dielectric layers 40 opposite the carrier substrate 38, and a metal transducer, or IDT, 42 on the surface of the piezoelectric layer 36 opposite the carrier substrate 38. Alternatively, there may be no dielectric layer(s) 40 such that the piezoelectric layer 36 is on (e.g., directly on) the surface of the carrier substrate 38.

If the Bulk Acoustic Wave (BAW) velocity of the carrier substrate 38 in the direction of propagation of the SAW is larger than the velocity of the (pseudo) SAW device 34, then it is possible to guide the acoustic energy inside the piezoelectric layer 36, and the loss into the bulk (i.e., the loss into the substrate) can be cancelled. Several intermediate layers (e.g., the one or more dielectric layers 40) can be placed between the piezoelectric layer 36 and the carrier substrate 38. These layers can be used to improve the acoustic guiding or the piezoelectric coupling, or they may be required for the manufacturing process of the device. For example, this type of approach has been proposed in U.S. Pat. No. 6,445,265, entitled DEVICE WITH ACOUSTIC WAVES GUIDED IN A FINE PIEZOELECTRIC MATERIAL FILM BONDED WITH A MOLECULAR BONDING ON A BEARING SUBSTRATE AND METHOD FOR MAKING THE SAME, issued Sep. 3, 2002; French Patent No. 2788176, entitled DISPOSITIF A ONDES ACOUSTIQUES GUIDEES DANS UNE FINE COUCHE DE MATERIAU PIEZO-ELECTRIQUE COLLEE PAR UNE COLLE MOLECULAIRE SUR UN SUBSTRAT PORTEUR ET PROCEDE DE FABRICATION, issued May 25, 2001; Solal, M. et al., "Oriented Lithium Niobate Layers Transferred on 4" [100] Silicon Wafer for RF SAW Devices," Proceedings of the 2002 IEEE Ultrasonics Symposium, Vol. 1, Oct. 8-11, 2002, pages 131-134 (hereinafter "Sola)"); and Pastureaud, T. et al., "High-Frequency Surface Acoustic Waves Excited on Thin-Oriented LiNbO$_3$ Single-Crystal Layers Transferred onto Silicon," IEEE Transactions on Ultrasonics, Ferroelectrics, and Frequency Control, Vol. 54. No. 4, April 2007, pages 870-876 (hereinafter "Pastureaud"). These documents disclose a SAW device built on a thin layer of piezoelectric material on top of a carrier substrate. Other layers can be present between the piezoelectric layer and the carrier substrate. These intermediate layers usually are dielectric layers, but in some cases it was proposed to use metallic layers. Piezoelectric layers are also possible. The velocity in the carrier substrate is large enough to allow the acoustic wave to be guided.

The process used to manufacture the SAW device 34 uses, in some examples, wafer bonding of a wafer of piezoelectric material on the carrier substrate 38 or the carrier substrate 38 with deposited layers (e.g., the one or more dielectric layers 40). It is also relatively common to use Silicon Oxide as one of the layers 40 and to bond the piezoelectric layer 36 onto the Silicon Oxide layer. The piezoelectric layer 36 can be formed by using, e.g., an ion slicing process as described in U.S. Pat. No. 6,445,265; French Patent No. 2788176; Solal; and Pastureaud. In this case, a piezoelectric substrate is implanted before being bonded to the carrier substrate 38. This implantation produces defects inside the piezoelectric substrate at a depth depending on the implantation energy. This allows the piezoelectric substrate to be broken and a thin layer of piezoelectric material to remain at the surface of the carrier substrate 38 as the piezoelectric layer 36. The drawback of this approach is that the thickness of the piezoelectric substrate is limited by the implantation energy, and it is difficult to obtain piezoelectric layers thicker than some tenths of micrometers. Also, the implantation may damage the piezoelectric film resulting in more losses or smaller coupling coefficient. This process is generally referred as "ion slicing." An alternate process consists of grinding the piezoelectric substrate in order to get a thin layer of piezoelectric material (i.e., the piezoelectric layer 36). In this case, the thickness accuracy is difficult to obtain, and it is usually a good practice to choose a frequency and layer thickness minimizing the sensitivity of the frequency to the fabrication process.

The choice of the carrier substrate 38 is critical to obtain good performance. U.S. Pat. No. 6,445,265 and French Patent No. 2788176 disclose a carrier substrate made of glass, sapphire, Si, or Gallium Arsenide, whereas a commonly used carrier substrate is one made of Si. One problem of Si is its conductivity, which results in losses by dielectric influence. This can be reduced by treating the Si by implantation or using relatively thick layers between the piezoelectric layer 36 and the carrier substrate 38. In addition to increasing the manufacturing cost of the SAW device 34, the use of deposited layers may result in some increase of the acoustic propagation loss due to the difficulty of getting good quality deposited materials. This problem is present when a Silicon Oxide layer is used between the carrier substrate 38 and the piezoelectric layer 36. On the hand, the use of Silicon Oxide is favorable for its positive temperature coefficient of velocity, which can be used to reduce the TCF of the SAW device 34. Also, Silicon Oxide has the advantage of having a low dielectric permittivity, which reduces the capacitance of the SAW device 34 and increases its coupling factor.

Figure 7:
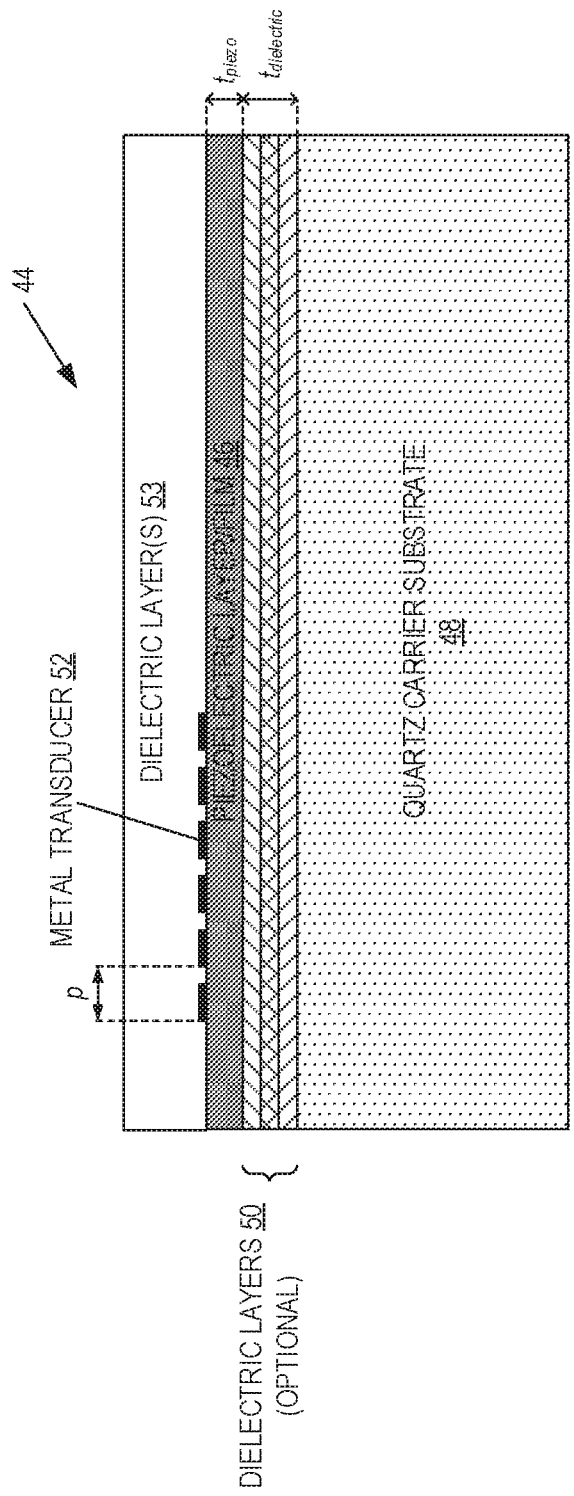
FIG. 7 is a diagram illustrating a SAW device having a quartz carrier substrate, a piezoelectric film/layer, and optionally one or more dielectric layers according to some embodiments of the present disclosure.

FIG. 7 illustrates a SAW device 44 according to some embodiments of the present disclosure. As illustrated, the SAW device 44 includes a piezoelectric layer, or film, 46 on a quartz carrier substrate 48, optionally one or more dielectric layers 50 on (e.g., directly on) the surface of the quartz carrier substrate 48, the piezoelectric layer 46 on the surface of the one or more dielectric layers 50 opposite the quartz carrier substrate 48, a metal transducer, or IDT, 52 on the surface of the piezoelectric layer 46 opposite the quartz carrier substrate 48, and optionally one or more dielectric layers 53 (e.g., one or more layers of Silicon Oxide, which may in some embodiments be doped) on the surface of the metal transducer 52 and an exposed surface of the piezoelectric layer 46. Note that while only one metal transducer 52 is illustrated, it should be appreciated that there may be any number of one or more metal transducers 52 and gratings/reflectors on the surface of the piezoelectric layer 46. The separation between the individual fingers of the metal transducer 52 defines a period (p), which is referred to herein as a transducer electrode period (p). Again, while the one or more dielectric layers 50 and 53 are illustrated in FIG. 7, the one or more dielectric layers 50 and 53 are optional. Further, in some embodiments, the one or more dielectric layers 50 include a layer of Silicon Oxide that is, in some embodiments, doped with a dopant such as e.g., Fluoride or Boron in order to e.g., further improve the TCF.

The choice of the material used for the carrier substrate 48 is critical for the performance of the SAW device 44. The carrier substrate 48 needs to have the following properties:

The carrier substrate 48 has to be insulating. A metallic substrate produces a strong coupling between a filter input and output and adds a capacitance that reduces the electroacoustic coupling. A semiconductor substrate also produces some losses due to its conductivity.

The carrier substrate 48 needs to have a low permittivity to reduce the device capacitance and to increase the piezoelectric coupling.

The carrier substrate 48 needs to have low acoustic viscous losses, which can be obtained normally by using a monocrystalline substrate.

The TCF for the carrier substrate 48 should be small (in absolute value) and if possible have a sign opposite to that of the TCF of the piezoelectric layer 46, which is negative. Additionally, a low coefficient of thermal expansion is favorable.

One of the crystals widely used for acoustic devices is quartz. Quartz presents several advantages:

Quartz has a low dielectric constant of about 4.5.

Quartz is not a semiconductor, which means that its conductivity is very low.

Quartz has been extensively studied for SAW and BAW devices, and quality of quartz has been enhanced to reduce viscous losses. For this reason, resonators with very good quality factors can be obtained using a piezoelectric layer on quartz.

From the point of view of thermal sensitivity, quartz has the advantage of a low thermal sensitivity and has compensated cuts for which the temperature coefficient of frequency is 0.

As such, quartz is utilized as the material for the carrier substrate 48 of the SAW device 44.

The one or more dielectric layers 50 are optional. If used, the one or more dielectric layers 50 may include one or dielectric materials such as, for example, Silicon Oxide. The dielectric layer(s) 50 are each normally thinner than the acoustic wavelength. The piezoelectric layer 46 is formed of any suitable piezoelectric material(s). In some preferred embodiments described herein, the piezoelectric layer 46 is formed of LT, or LiNbO$_3$, but is not limited thereto. In some embodiments, the piezoelectric layer 46 has a thickness ($t_{piezo}$) that is less than four times the transducer electrode period (p). In other embodiments, the thickness ($t_{piezo}$) f the piezoelectric layer 46 is less than twice the transducer electrode period (p). Also, as it is well known, optionally one or several dielectric layers (i.e., the dielectric layer(s) 53), like for example Silicon Oxide, Silicon Nitride, and Aluminum Oxide, can be deposited at the surface to realize a passivation. It can also be advantageous to embed the electrode inside a dielectric film of Silicon Oxide to further reduce the temperature sensitivity of the SAW device 44.

For example, in some embodiments, the piezoelectric layer 46 is LT, and the thickness ($t_{piezo}$) of the piezoelectric layer 46 is less than 2 p. Further, in some embodiments, the LT used for the piezoelectric layer 46 has an orientation between Y and Y+60 degrees. In some other embodiments, the piezoelectric layer 46 is LiNbO$_3$, and the thickness ($t_{piezo}$) of the piezoelectric layer 46 is less than 2 p. Further, in some embodiments, the LiNbO$_3$ used for the piezoelectric layer 46 has an orientation between Y−20 degrees and Y+60 degrees.

As discussed below in detail, in some embodiments, the propagation direction of the metal transducer 52 forms an angle smaller than 10 degrees with the z-axis or the −z-axis of the quartz crystal of the quartz carrier substrate 48. Further, in some embodiments, the piezoelectric layer 46 is LT and the thickness ($t_{piezo}$) of the piezoelectric layer 46 is less than 2 p. Further, in some embodiments, the LT used for the piezoelectric layer 46 has an orientation between Y and Y+60 degrees and a propagation along the x-axis of the LT (where the x-axis is aligned with the z-axis of the quartz crystal for propagation along the z-axis in the quartz carrier substrate 48). Further, in some embodiments, the thickness ($t_{piezo}$) of the piezoelectric layer 46 is less than 60% of the transducer electrode period (p). Further, in some embodiments, the quartz carrier substrate 48 is made of quartz with its normal (i.e., the normal of the quartz carrier substrate 48) oriented along the x-axis or the y-axis of the quartz crystal. Still further, in some embodiments, the thickness ($t_{piezo}$) of the piezoelectric layer 46 is between 30% and 50% of the transducer electrode period (p). In other embodiments, the quartz carrier substrate 48 is made of quartz with its normal (i.e., the normal of the quartz carrier substrate 48) forming an angle between 30 degrees and 55 degrees with the x-axis of the quartz crystal. Still further, in some embodiments, the thickness ($t_{piezo}$) of the piezoelectric layer 46 is between 20% and 40% of the transducer electrode period (p).

The SAW device 44 is, in the illustrated example, a SAW resonator. This SAW resonator may be utilized in any number of devices such as, for example, a filter that includes one or more of the SAW resonators 44, a ladder filter that includes at least two of the SAW resonators 44, a CRF that includes at least two of the SAW resonators 44 placed between two gratings/reflectors, and a filter using the cascade of the aforementioned CRF connected in series or parallel with at least one of the SAW resonators 44. Further, these filters may be utilized in, e.g., a duplexer (i.e., a duplex filter), a multiplexer (i.e., a multiplex filter), or the like.

The following discussion provides a discussion of simulation results for some example implementations of the SAW device 44 of FIG. 7 that illustrate the importance of the orientation of the quartz carrier substrate 48 according to some embodiments of the present disclosure. As discussed above, if the BAW velocity of the quartz carrier substrate 48 in the direction of propagation of the SAW is larger than the velocity of the (pseudo) SAW device 44, then it is possible to guide the acoustic energy inside the piezoelectric layer 46, and the loss into the bulk can be cancelled. In other words, it is desirable for the BAW velocity of the quartz carrier substrate 48 in the direction of propagation of the SAW to be larger than the velocity of the SAW device 44.

Figure 8:
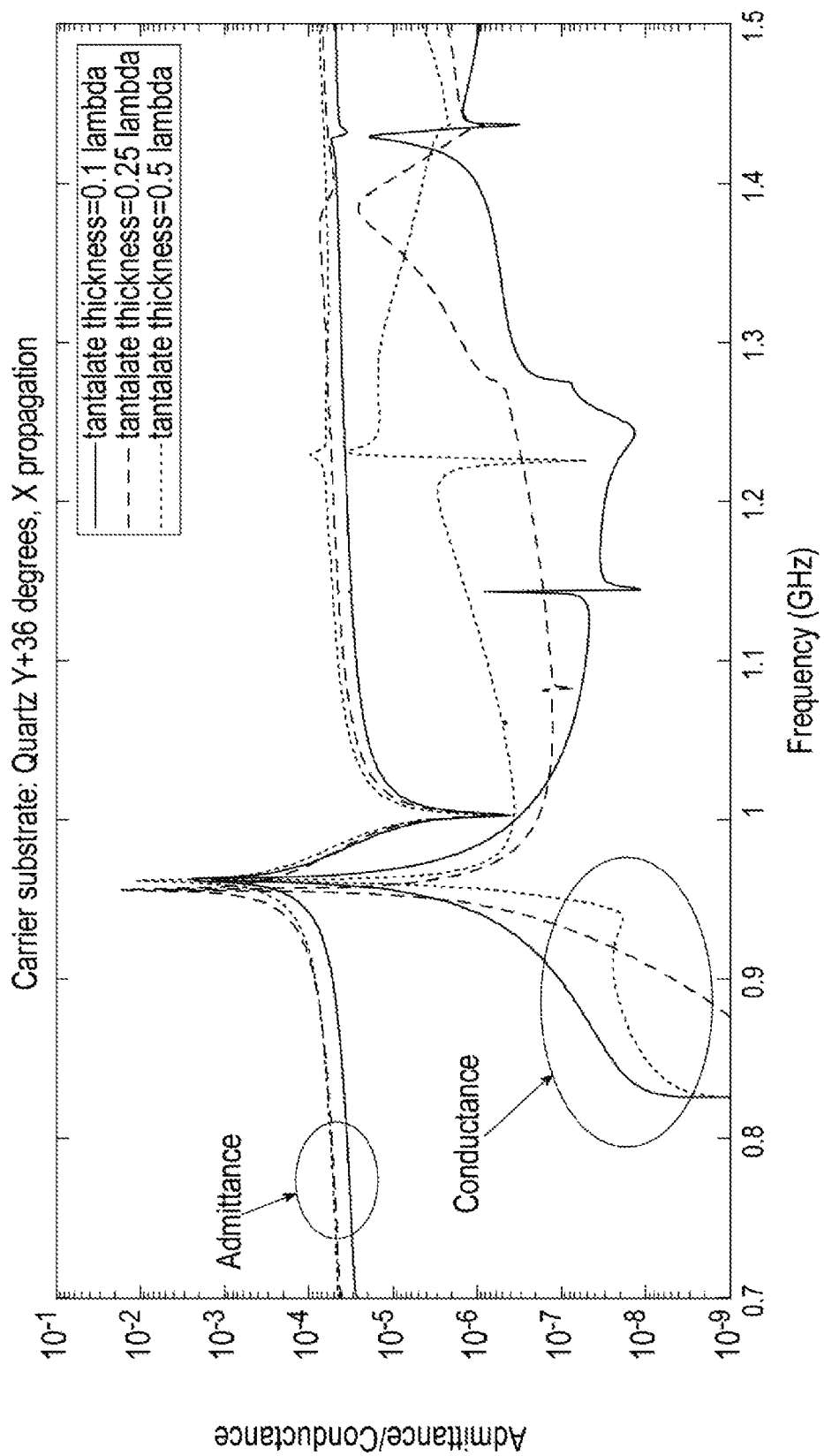
FIG. 8 is a plot showing admittance and conductance for Lithium Tantalate ($LiTaO_3$) (sometimes referred to herein as "LT") Y+42 degrees on quartz Y+36 degrees.

In this regard, FIG. 8 shows simulation results for an implementation of the SAW device 44 in which the piezoelectric layer 46 is a film of LT with an orientation of Y+42 degrees, the quartz carrier substrate 48 is formed of quartz with an orientation of Y+36 degrees, and the propagation of the SAW is along the x-axis of the quartz crystal of the quartz carrier substrate 48 (i.e., there is X propagation), where the x-axis of the quartz crystal of the quartz carrier substrate 48 is aligned with the x-axis of the LT. The results show that the bulk cutoff frequency in the quartz carrier substrate 48 is below the resonance frequency of the SAW device 44. This means that acoustic energy can be radiated in the bulk and results in propagation losses and low quality factors. Thus, this is an undesirable orientation.

Figure 9:
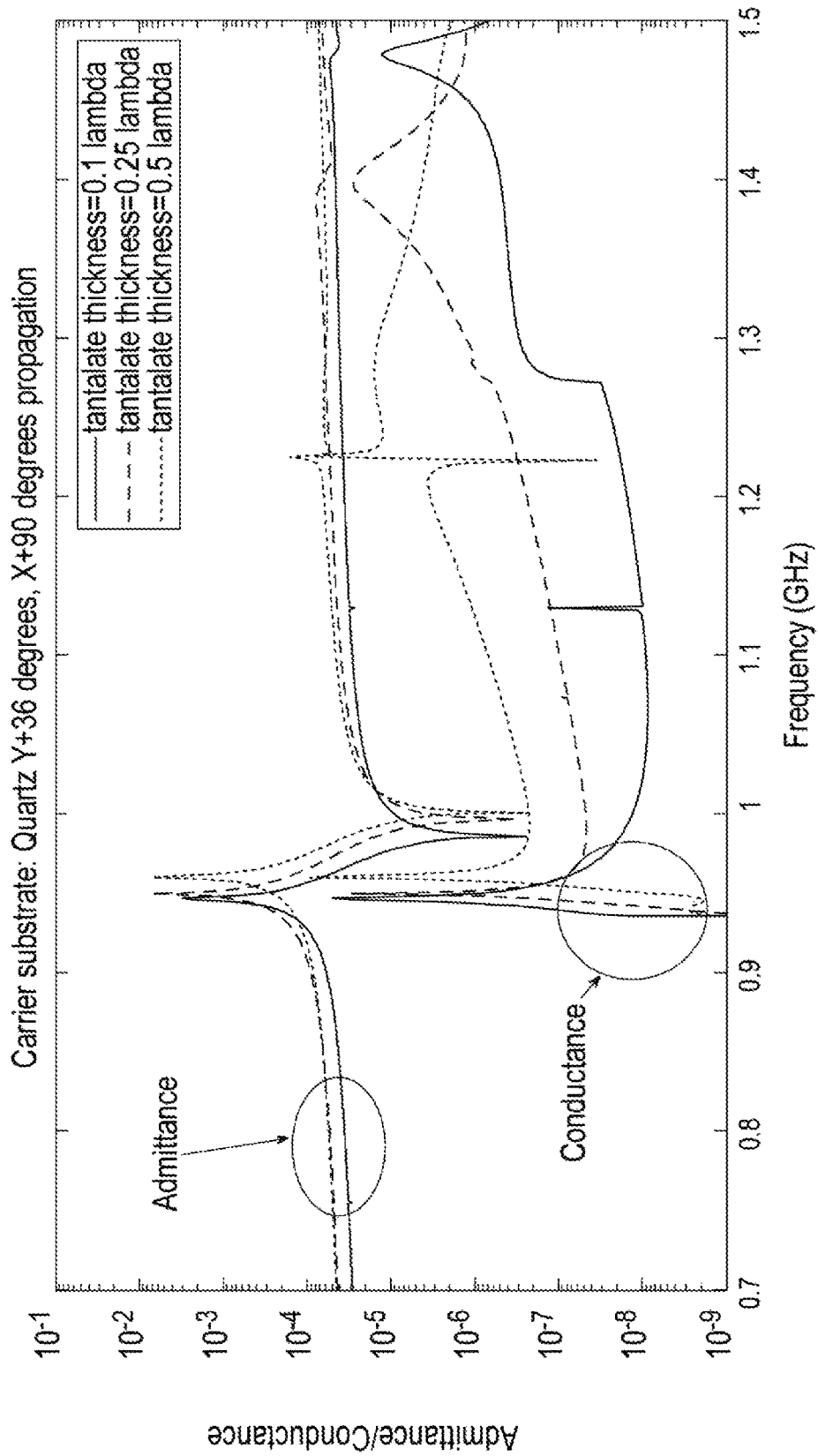
FIG. 9 is a plot showing admittance and conductance for LT Y+42 degrees on quartz Y+36 degrees.

Similarly, FIG. 9 shows simulation results for an implementation of the SAW device 44 in which the piezoelectric layer 46 is a film of LT with an orientation of Y+42 degrees, the quartz carrier substrate 48 is formed of quartz with an orientation of Y+36 degrees, but with a propagation of the SAWs at 90 degrees from the x-axis of quartz crystal of the quartz carrier substrate 48. This is an orientation for so-called Surface Transverse Wave (STW) devices on quartz. As illustrated, the bulk cutoff frequency is at a frequency close to the resonance frequency of the SAW device 44, which causes the main mode to leak into the bulk and reduces its quality factor. Thus, this is also an undesirable orientation.

The problem is that the bulk mode in the quartz carrier substrate 48 for these orientations of quartz is too slow. Above the cutoff frequency, a lot of energy is lost in the bulk. If p is the electrode period of the metal transducer 52, the cutoff frequency is Vs/2 p, where Vs is the velocity in the quartz carrier substrate 48 for the propagation direction of the SAW. Velocities in quartz are often too small.

Figure 10:
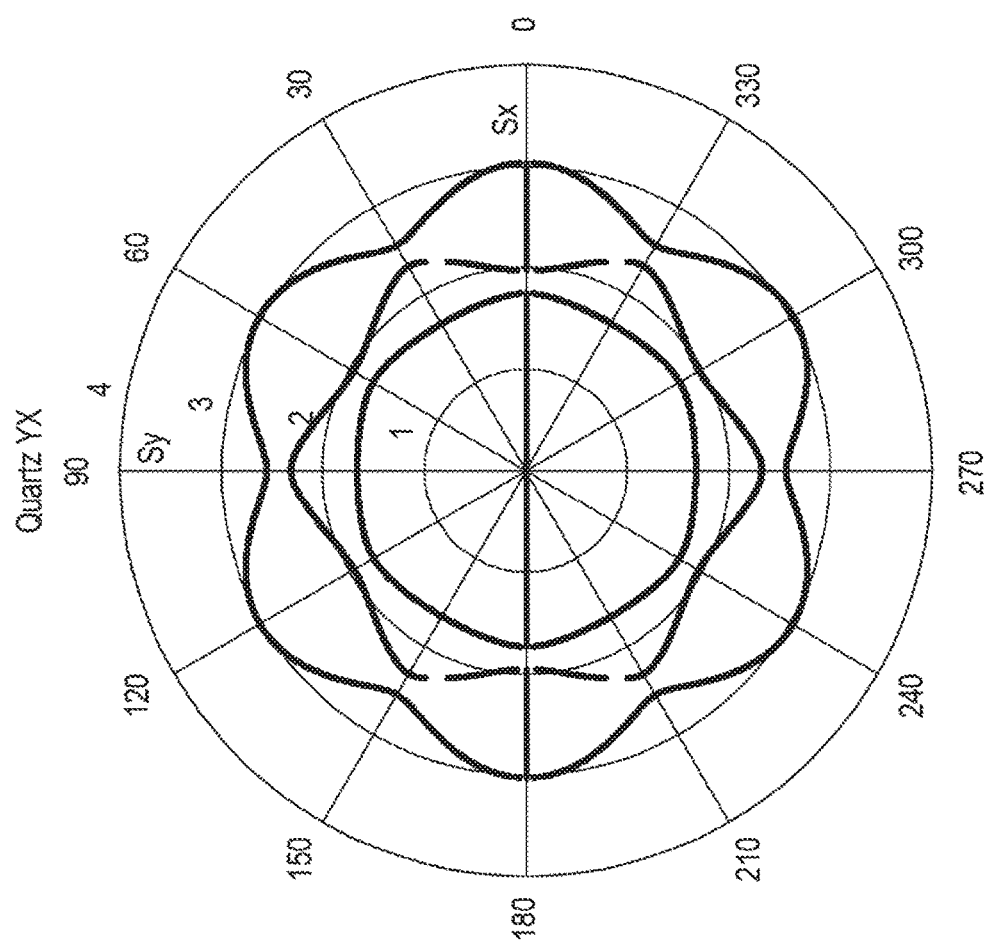
FIG. 10 is a plot showing slowness curves for bulk acoustic modes on quartz in the XY plane (units $10^{-4}$ seconds per meter (s/m))
Figure 11:
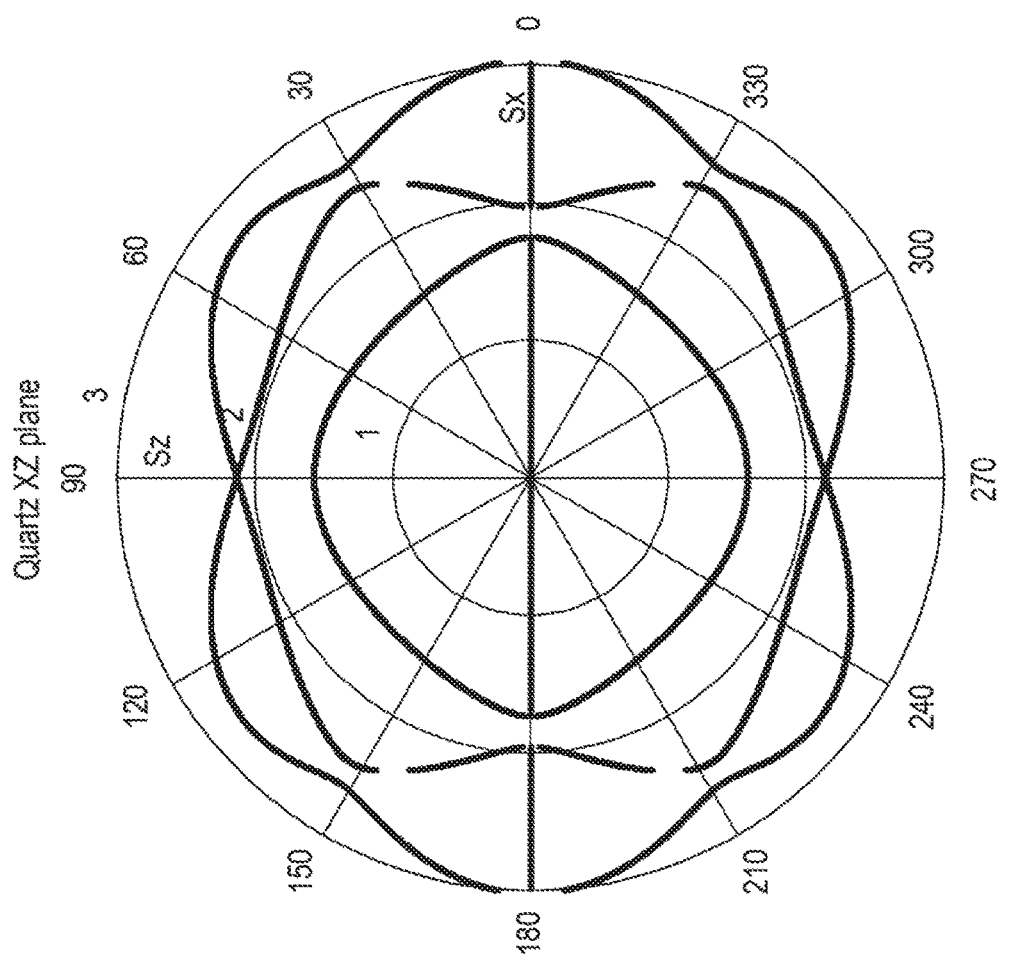
FIG. 11 is a plot showing slowness curves for bulk acoustic modes on quartz in the XZ plane (units $10^{-4}$ s/m)
Figure 12:
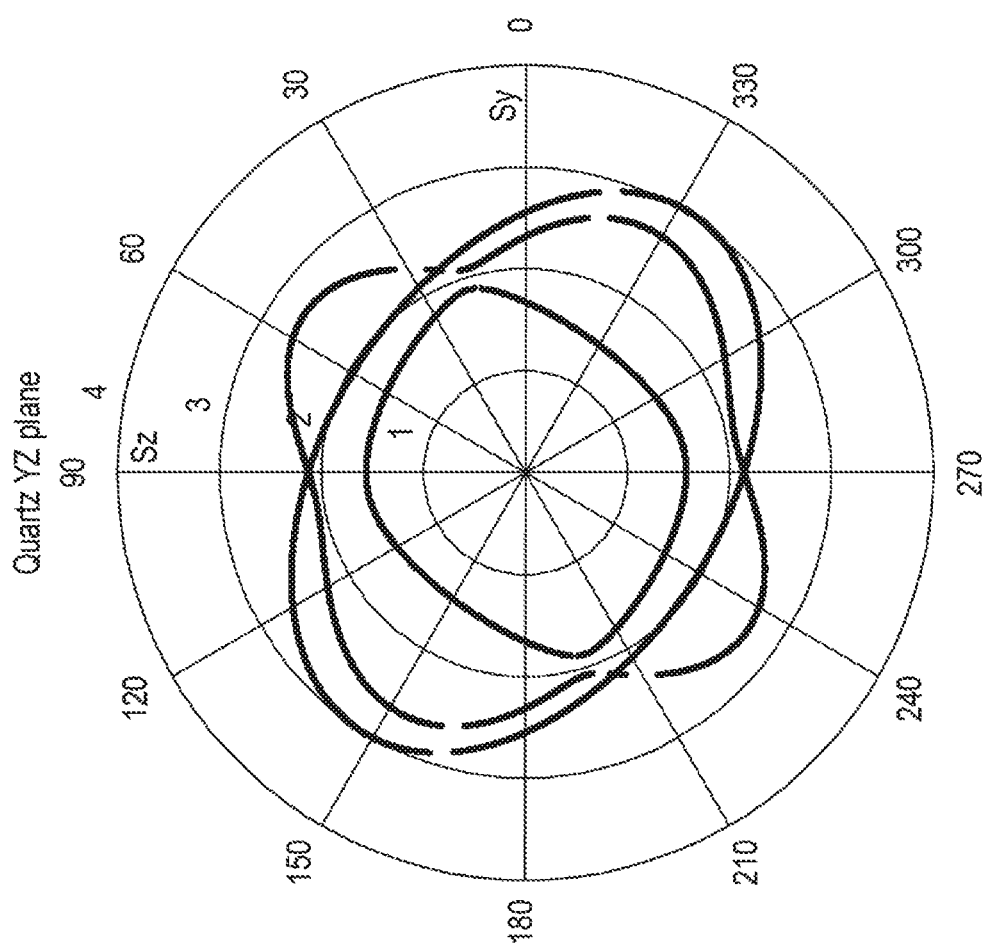
FIG. 12 is a plot showing slowness curves for bulk acoustic modes on quartz in the YZ plane (units $10^{-4}$ s/m)

FIGS. 10 through 12 show the BAW slowness curves for quartz in the XY, XZ, and YZ planes. It is shown that for most orientations, the slowest velocity is between 3300 meters per second (m/s) and 4000 m/s. These velocities are too slow compared to the velocity in LT (i.e., the corresponding cutoff frequency is not high enough to be above the resonance frequency). The orientation with the fastest slow shear velocity is the Z orientation, which has a velocity of about 4660 m/s. To have a cutoff frequency more than 10% higher than the resonance frequency (which, for this example, was assumed to be 1 Gigahertz (GHz) for a 2 micrometer (μm) period), the velocity in the quartz should be at least 4400 m/s or the slowness less than 2.273 10$^{-4}$ seconds per meter (s/m). This condition in the XZ plane is only for an angle range of ±8 degrees around the z-axis (or the −z-axis) and ±10 degrees in the YZ plane. Globally, this means that the carrier substrate 48 should be a substrate of quartz with a propagation direction that makes an angle smaller than 10 degrees with the crystal z-axis. As such, as mentioned above, in some embodiments, the propagation direction of the metal transducer 52 forms an angle smaller than 10 degrees with the z-axis or −z-axis of the quartz crystal of the quartz carrier substrate 48.

Figure 13:
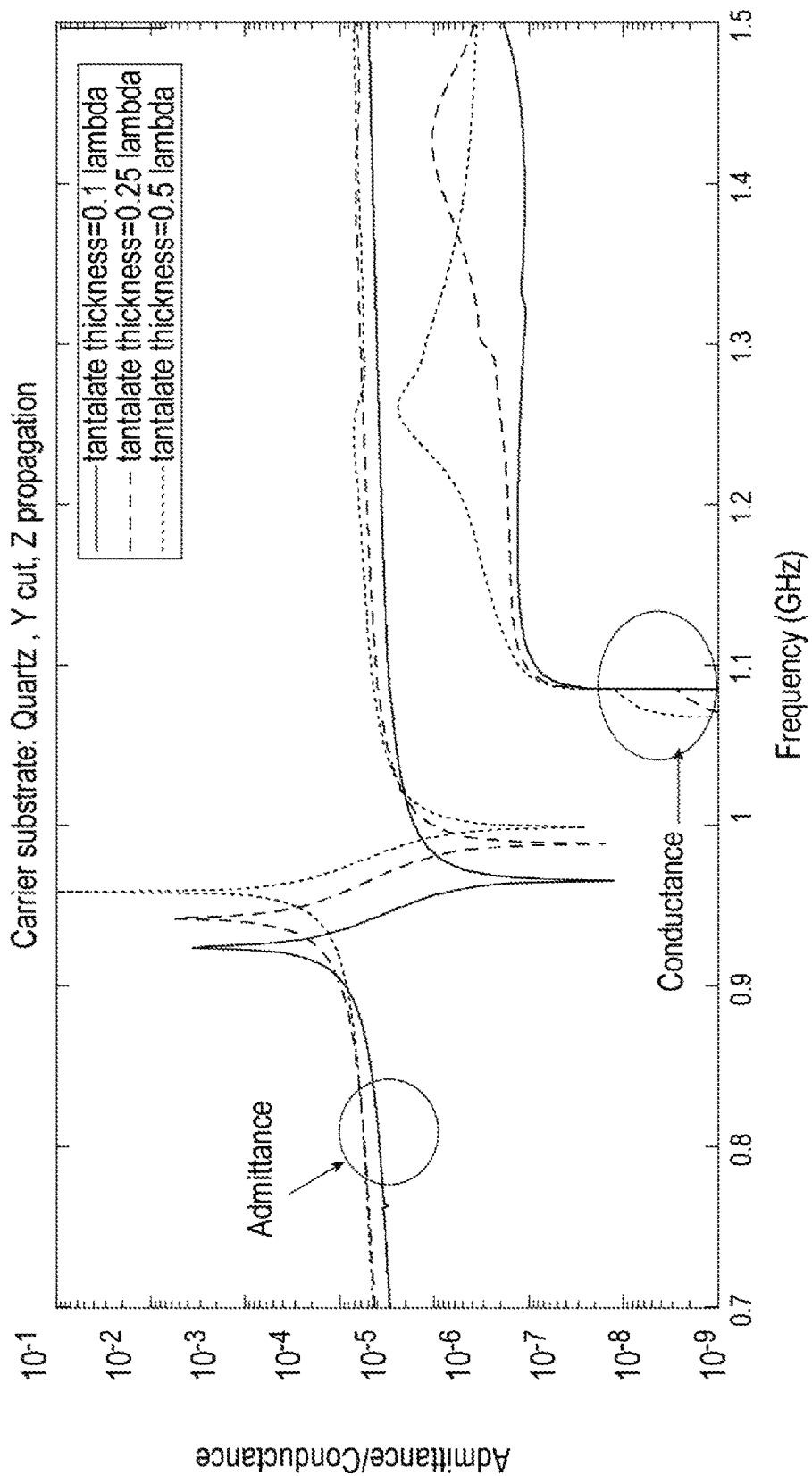
FIG. 13 is a plot showing admittance and conductance for LT Y+42 degrees on quartz cut Y cut Z propagation.

FIG. 13 shows the simulation results for an implementation of the SAW device 44 (as a SAW resonator) in which the piezoelectric layer 46 is a film of LT with an orientation of Y+42 degrees, X propagation on the quartz carrier substrate 48 made of quartz Y cut, and a propagation of the SAWs along the z-axis of quartz crystal of the quartz carrier substrate 48 (i.e., Z propagation). In other words, the crystallographic x-axis of the LT is aligned with the crystallographic z-axis of the quartz. The crystallographic y-axis of the quartz is perpendicular to the quartz plane, while the Y+42 axis for the LT is normal to the surface. As predicted by the slowness curves, the bulk cutoff frequency is far enough above the resonance frequency to have good guiding (and not have radiation losses in the band of a filter if this resonator and others on the same substrate but different frequencies are used to make a filter (e.g., a ladder filter)). Also, a very smooth response is obtained without spurious modes.

Figure 14:
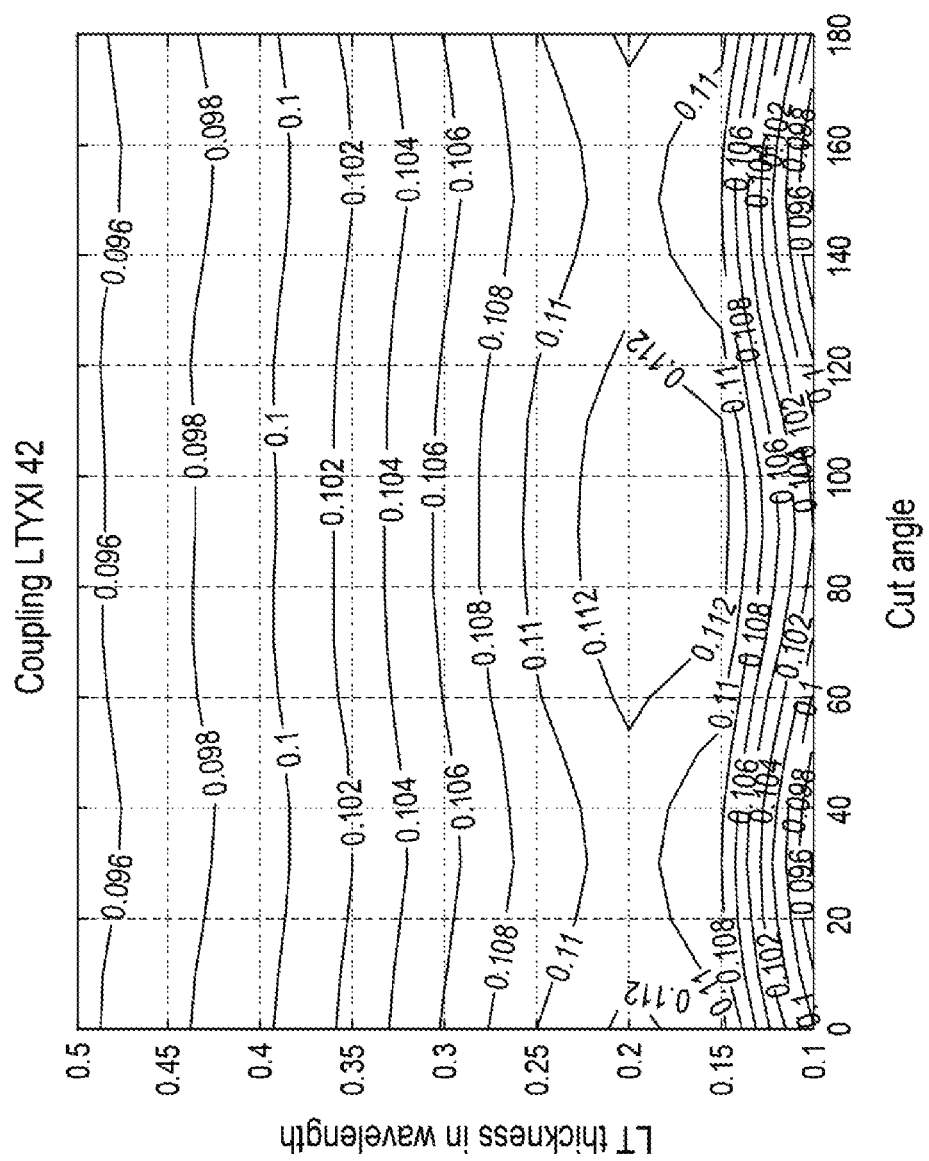
FIG. 14 is a plot showing the variation of the coupling factor for a film of LT with the orientation YXl42 on a carrier substrate of quartz ZXl teta, where the x axis is the carrier substrate angle and the y axis is the LT film thickness in wavelengths.
Figure 15:
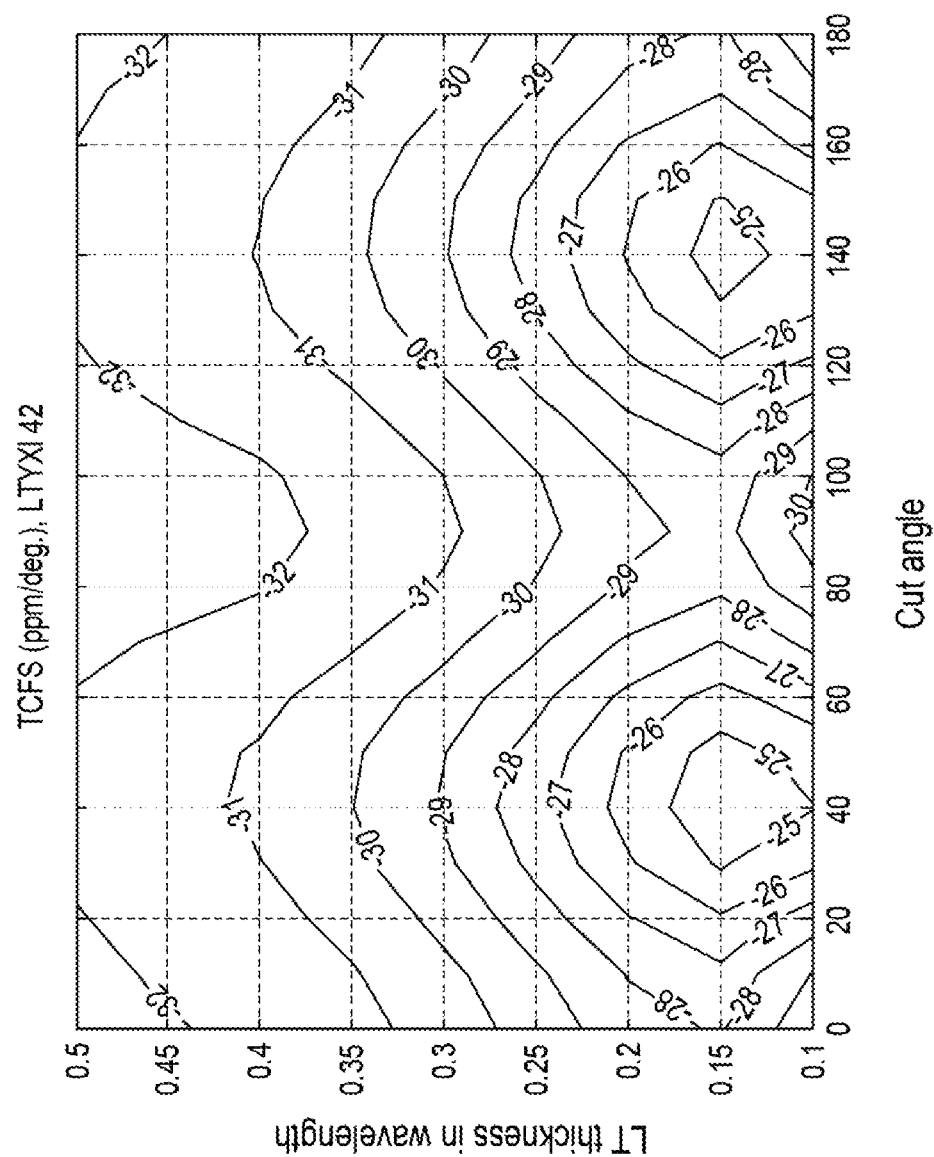
FIG. 15 is a plot showing the variation of the temperature coefficient of frequency at resonance for a film of LT with the orientation YXl42 on a carrier substrate of quartz ZXl teta, where the x axis is the carrier substrate angle and the y axis is the LT film thickness in wavelengths.
Figure 16:
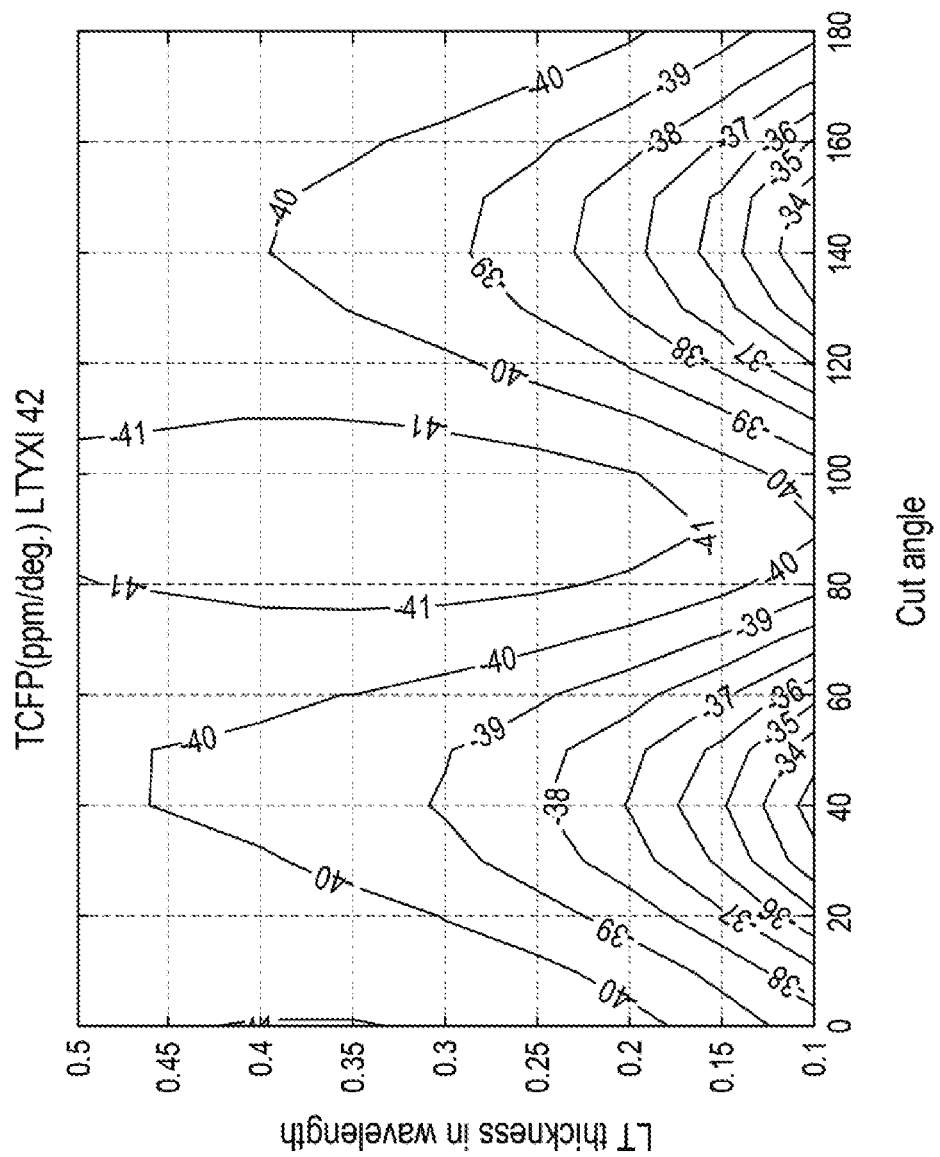
FIG. 16 is a plot showing the variation of the temperature coefficient of frequency at antiresonance for a film of LT with the orientation YXl42 on a carrier substrate of quartz ZXl teta, where the x axis is the carrier substrate angle and the y axis is the LT film thickness in wavelengths.

In addition to optimizations described above, in some embodiments, the cut angle of the quartz used for the quartz carrier substrate 48 is also selected to optimize one or more performance parameters of the SAW device 44 such as, e.g., piezoelectric coupling and/or TCF. In this regard, FIGS. 14 through 16 show simulation results for one example implementation of the SAW device 44 in which the piezoelectric layer 46 is a film of LT with an orientation of YXl42 (i.e., Y+42), where the carrier substrate 48 is made of quartz with an orientation XZl teta (i.e., quartz with propagation along the z-axis and plane rotated along the z-axis, where 0 corresponds to X orientation and 90 corresponds to Y orientation) as a function of the cut angle theta for the quartz carrier substrate 48 (x-axis in the graph) and the LT thickness (y-axis in the graph) in wavelength. In FIG. 14, it can be seen clearly that the best piezoelectric couplings are obtained for an angle theta close to 0 or 90 degrees, which corresponds to a carrier substrate of X or Y cut quartz with Z propagation. In FIGS. 15 and 16, it can be seen clearly that the best results for the TCFs are obtained for an angle theta close to 40 degrees (e.g., a range of 30 degrees to 55 degrees) or 140 degrees (e.g., a range of 130 degrees to 155 degrees).

Figure 17A:
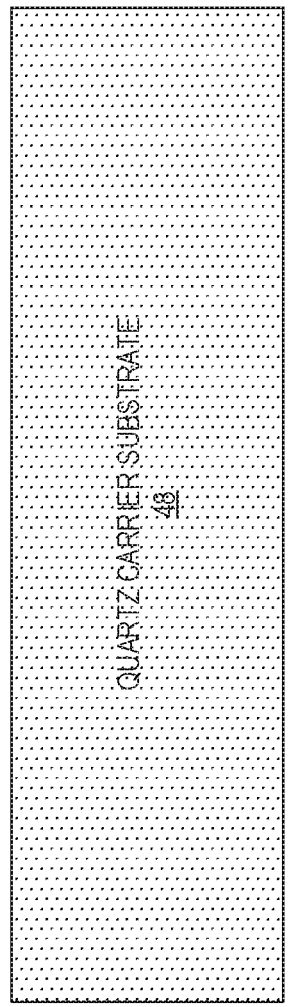
FIGS. 17A through 17G illustrate one example of a process for manufacturing the SAW device of FIG. 7 according to some embodiments of the present disclosure.
Figure 17B:
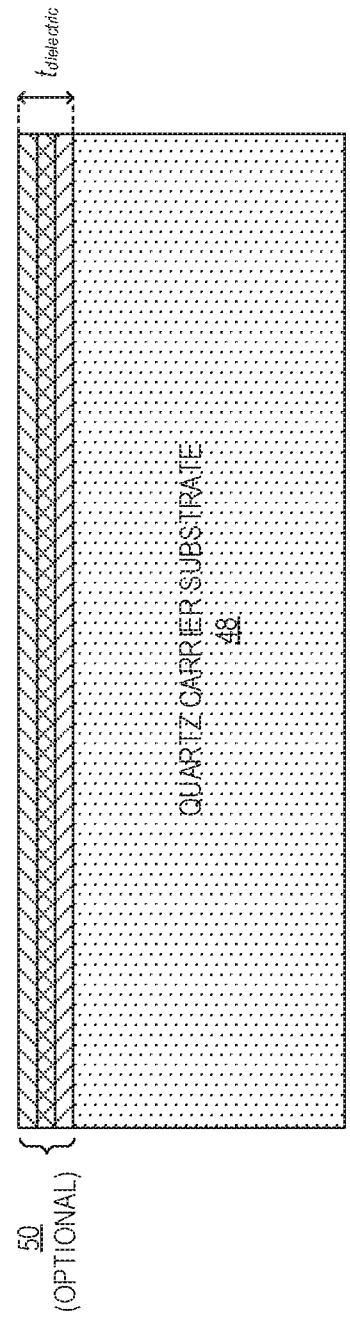
Figure 17C:
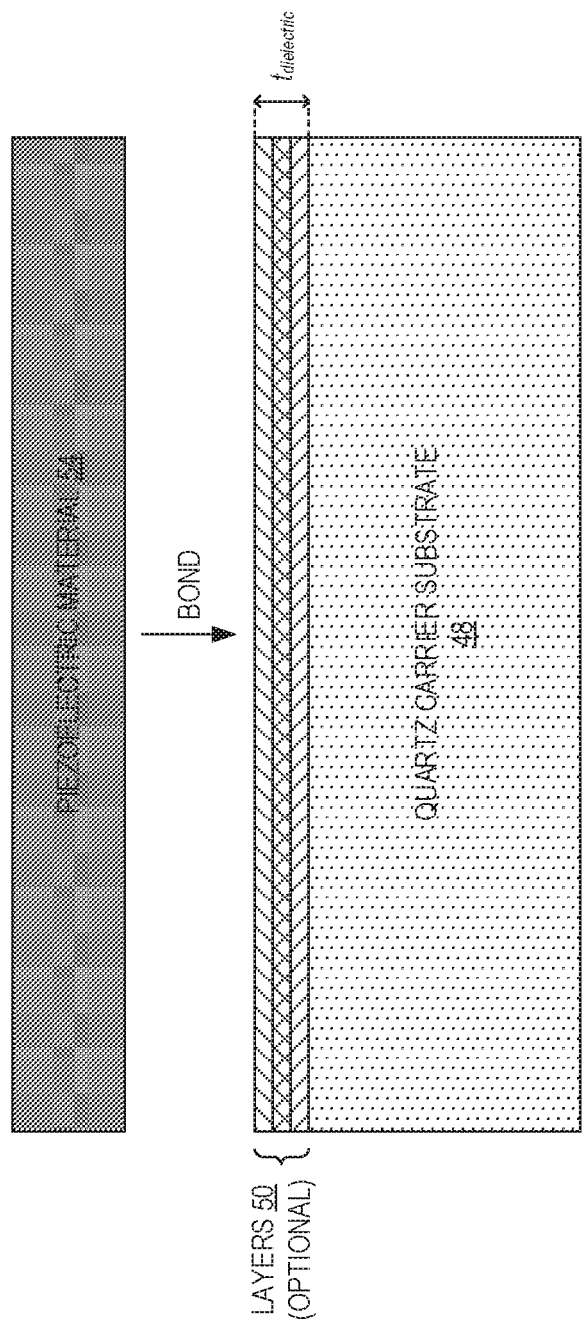
Figure 17D:
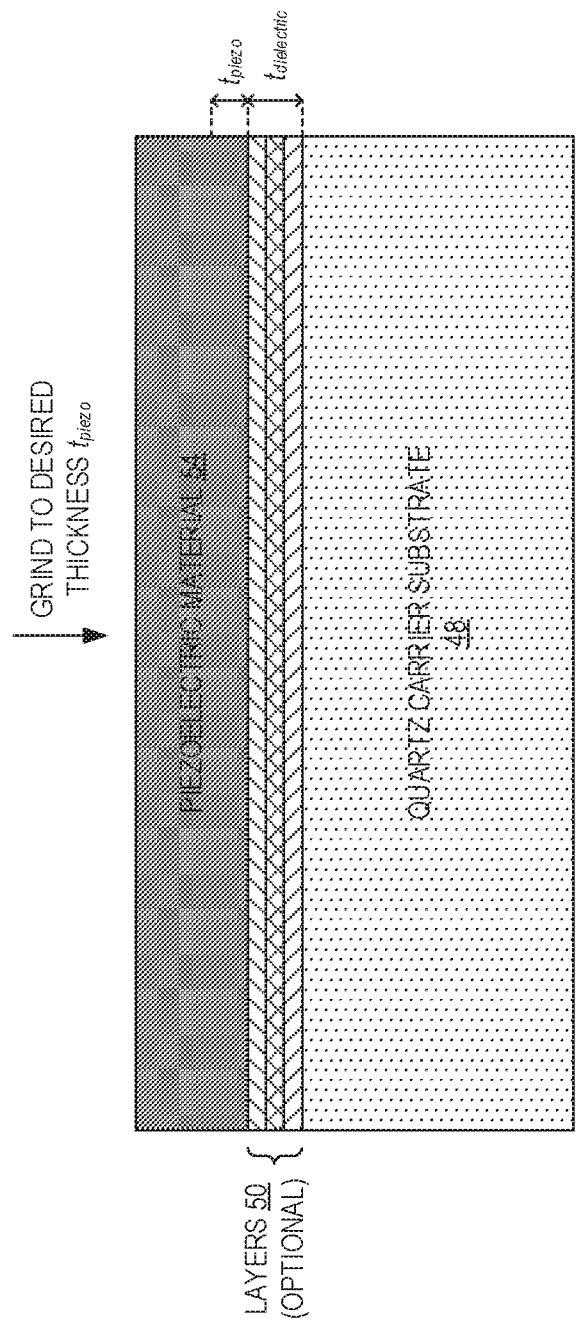
Figure 17E:
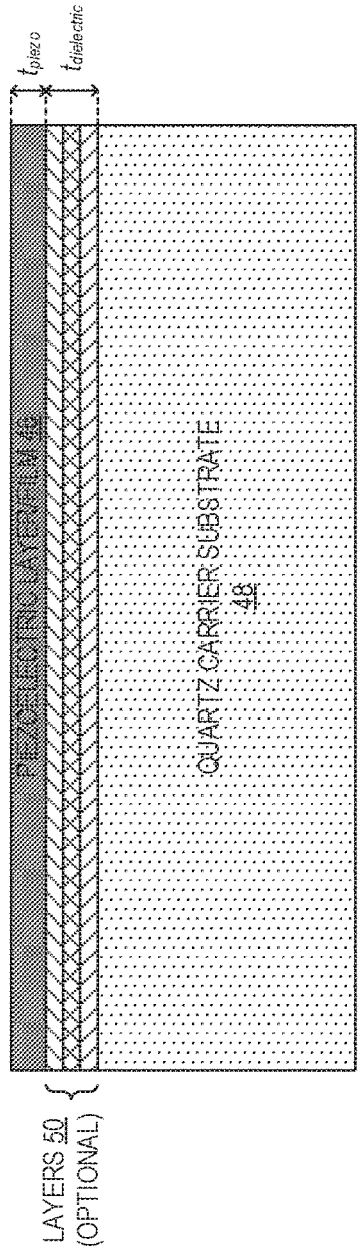
Figure 17F:
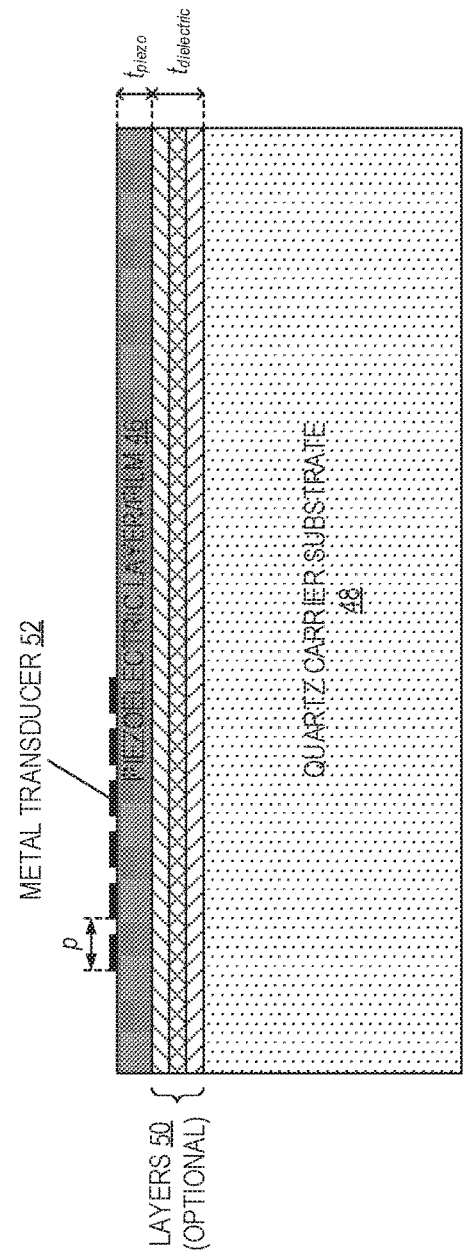
Figure 17G:
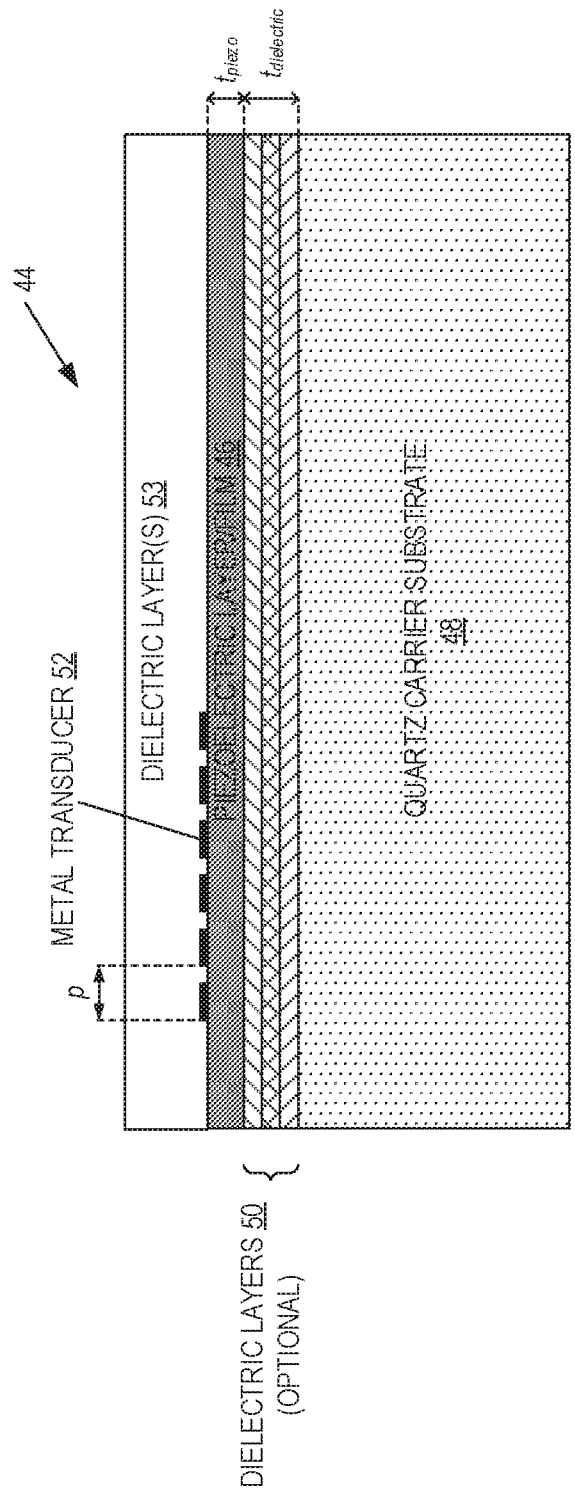

FIGS. 17A through 17G illustrate a process for fabricating the SAW device 44 of FIG. 7 according to some embodiments of the present disclosure. As illustrated in FIG. 17A, the process starts with the quartz carrier substrate 48. As illustrated in FIG. 17B, the one or more dielectric layers 50 (and/or other types of additional layers) are formed (e.g., deposited or bonded) on the surface of the quartz carrier substrate 48. Again, the dielectric layer(s) 50 are optional. A piezoelectric material 54 is bonded on the surface of the dielectric layer(s) 50 opposite the quartz carrier substrate 48 (or on the surface of the quartz carrier substrate 48 if the dielectric layer(s) 50 are not present), as illustrated in FIG. 17C. As illustrated in FIG. 17D, the piezoelectric material 54 is grinded or otherwise processed to form the piezoelectric layer 46 having the desired thickness ($t_{piezo}$). The resulting structure is illustrated in FIG. 17E. The metal transducer 52 is then formed on (e.g., directly on) the surface of the piezoelectric layer 46 opposite the dielectric layer(s) 50 (if present) and the quartz carrier substrate 48, as illustrated in FIG. 17F. Optionally, the one or more dielectric layers 53 are formed (e.g., deposited) on the surface of the metal transducer 52 and the exposed surface of the piezoelectric layer 46, as illustrated in FIG. 17G.

Figure 18A:
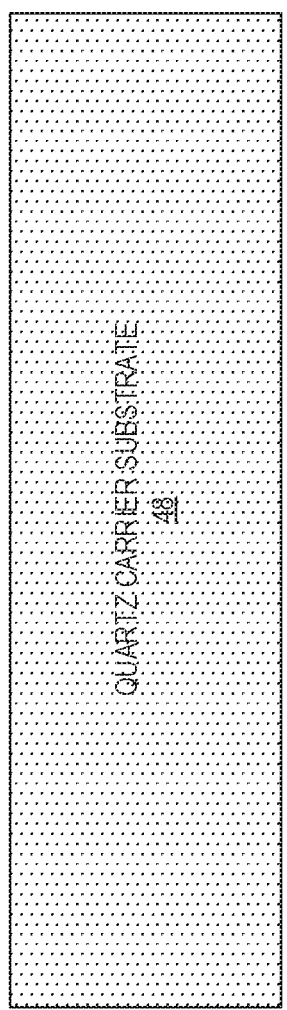
FIGS. 18A through 18H illustrate another example of a process for manufacturing the SAW device of FIG. 7 according to some embodiments of the present disclosure.
Figure 18B:
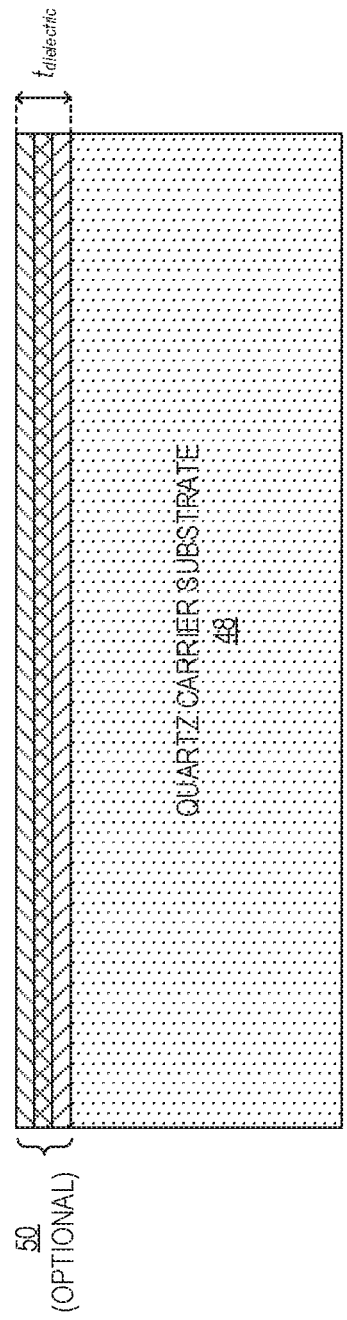
Figure 18C:
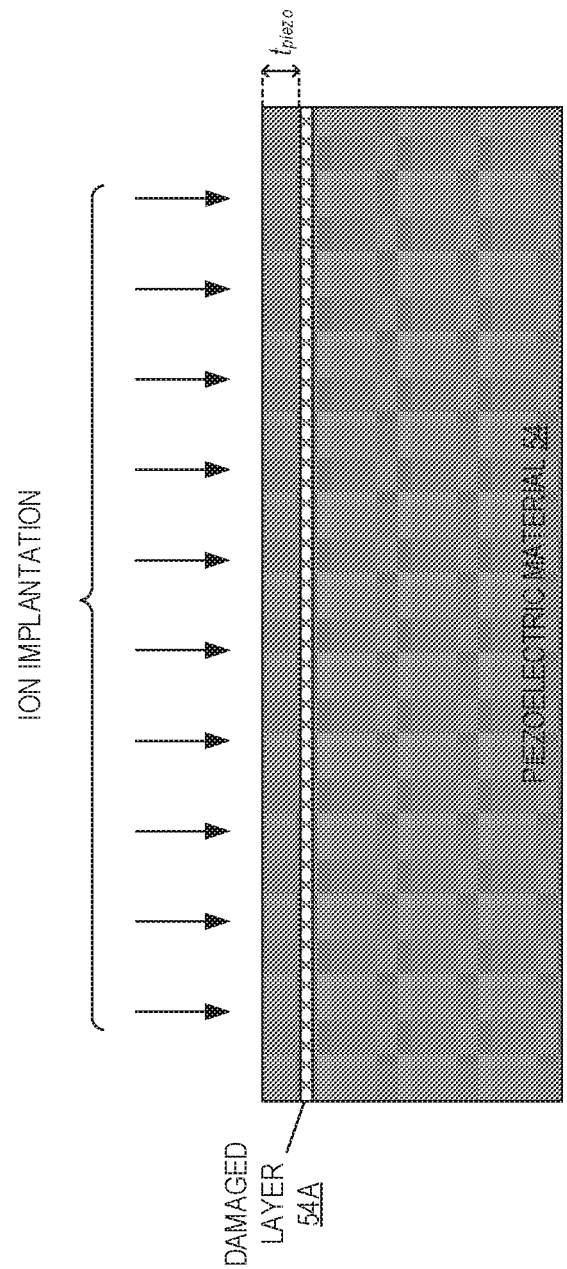
Figure 18D:
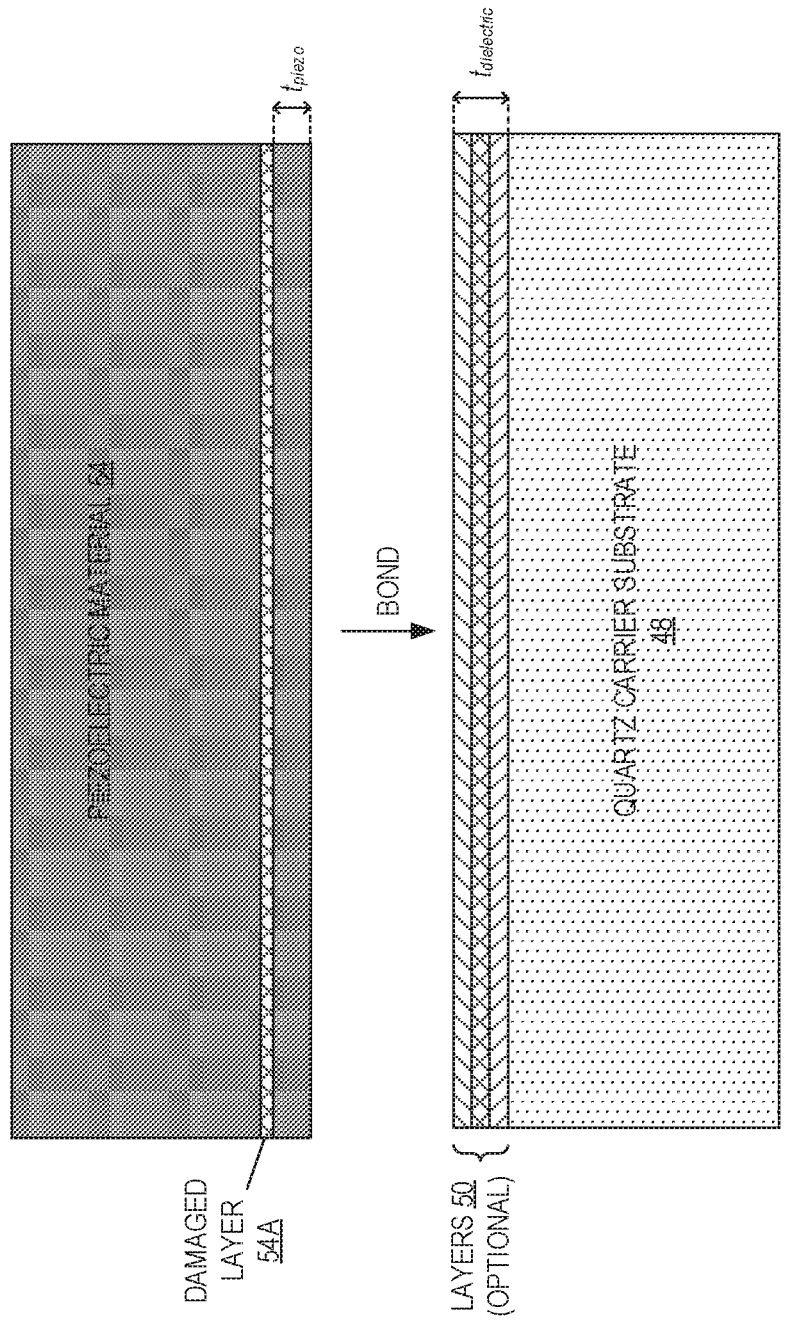
Figure 18E:
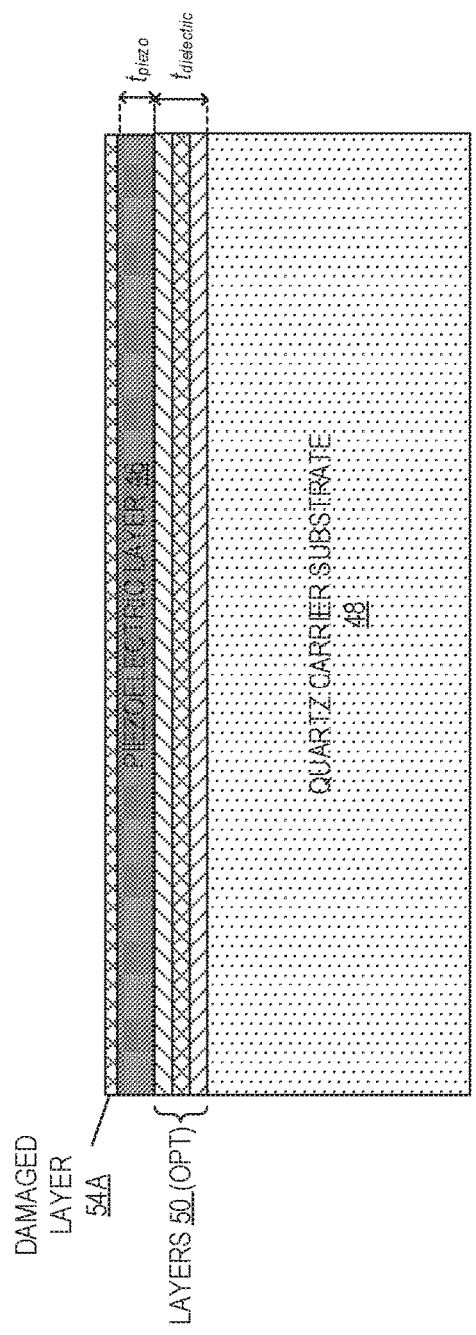
Figure 18F:
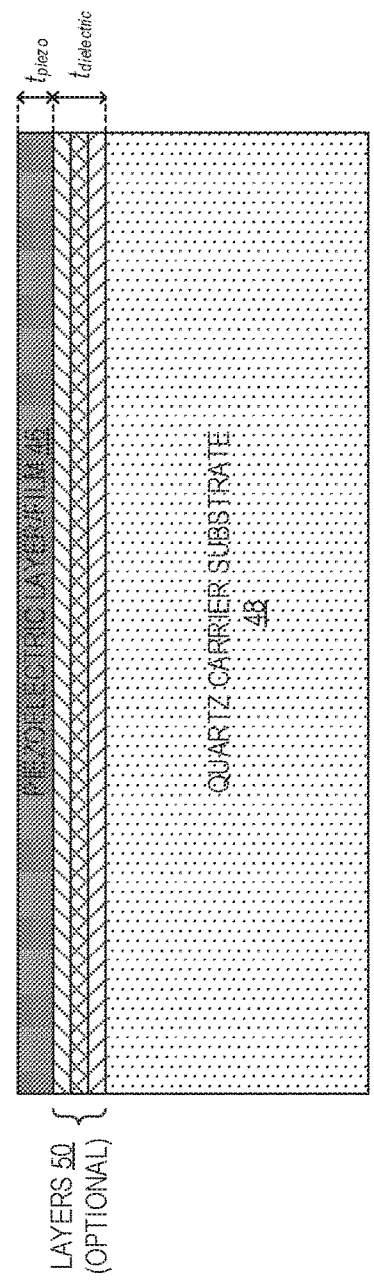
Figure 18G:
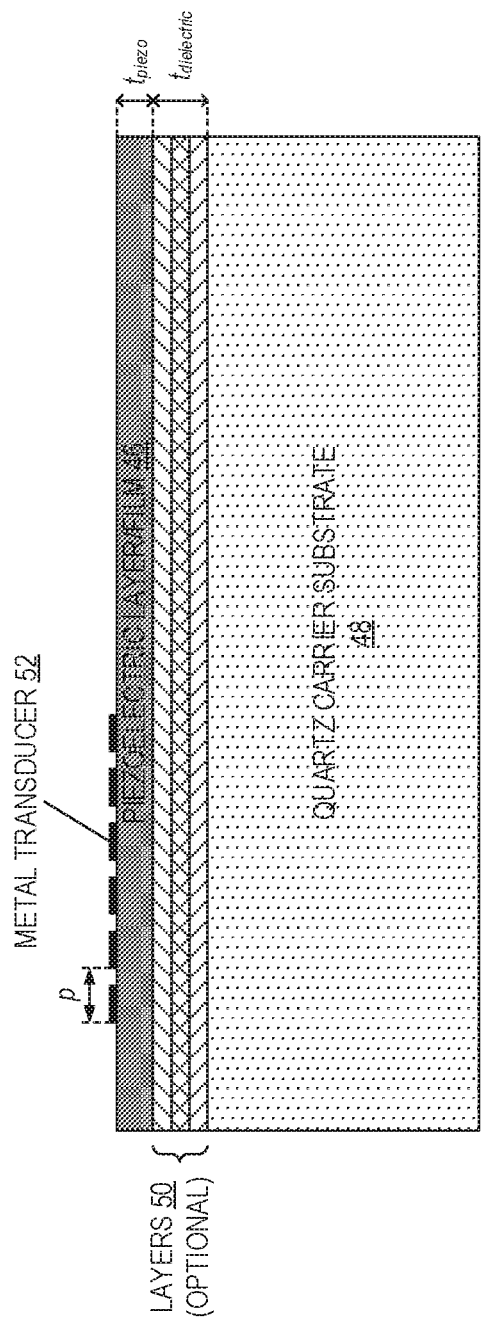
Figure 18H:
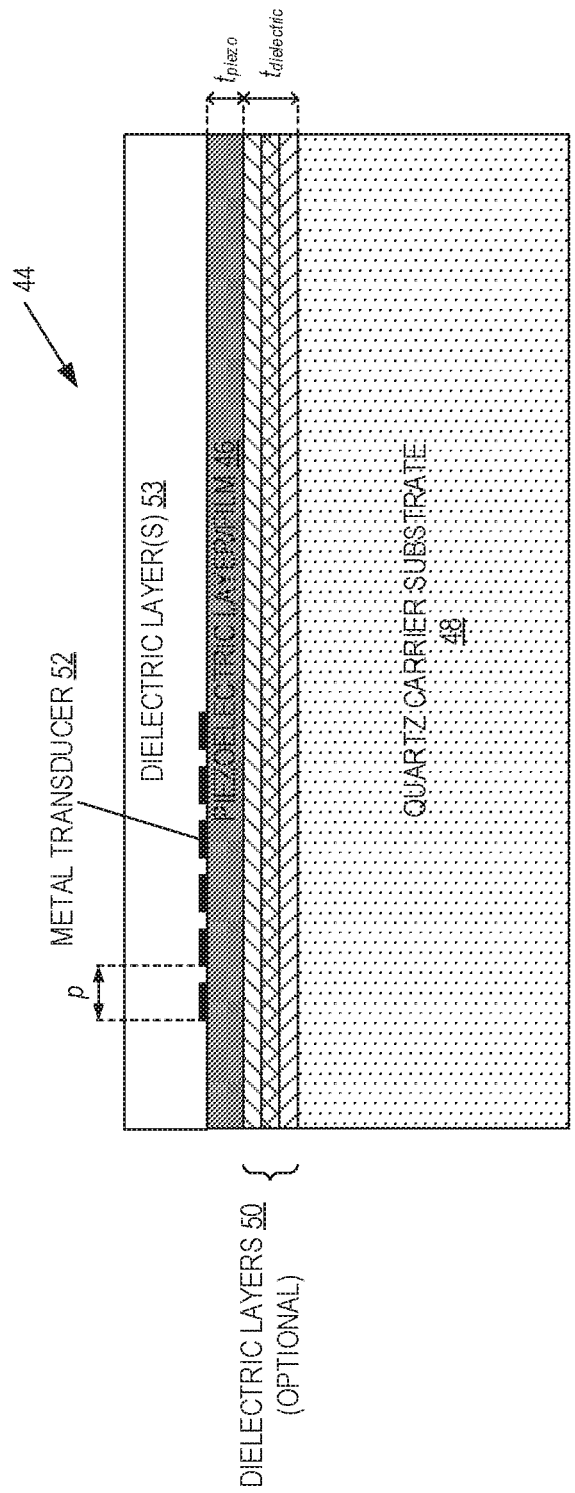

FIGS. 18A through 18H illustrate a process for fabricating the SAW device 44 of FIG. 7 according to some other embodiments of the present disclosure. As illustrated in FIG. 18A, the process starts with the quartz carrier substrate 48. As illustrated in FIG. 18B, the one or more dielectric layers 50 (and/or other types of additional layers) are formed (e.g., deposited or bonded) on the surface of the quartz carrier substrate 48. Again, the dielectric layer(s) 50 are optional. Ion implantation into the surface of a piezoelectric material 54, as illustrated in FIG. 18C, is used to create a damaged layer 54A within the piezoelectric material 54 at a desired, or controlled, depth that defines the desired thickness ($t_{piezo}$) of the piezoelectric layer 46. The piezoelectric material 54 is bonded on the surface of the dielectric layer(s) 50 opposite the quartz carrier substrate 48 (or on the surface of the quartz carrier substrate 48 if the dielectric layer(s) 50 are not present), as illustrated in FIG. 18D. As illustrated in FIGS. 18E and 18F, the portion of the piezoelectric material 54 above the damaged layer 54A is removed to thereby form the piezoelectric layer 46 having the desired thickness ($t_{piezo}$). Notably, the surface of the piezoelectric layer 46 is prefer- ably polished to remove any defects remaining on the surface of the piezoelectric layer 46. The resulting structure is illustrated in FIG. 18F. The metal transducer 52 is then formed on (e.g., directly on) the surface of the piezoelectric layer 46 opposite the dielectric layer(s) 50 (if present) and the quartz carrier substrate 48, as illustrated in FIG. 18G. Optionally, the one or more dielectric layers 53 are then formed (e.g., deposited) on the surface of the metal transducer 52 and the exposed surface of the underlying layers, as illustrated in FIG. 18H.

The present disclosure provides for, but is not limited to, the following:

An acoustic wave resonator comprising at least one interdigital transducer on a substrate comprising a piezoelectric layer bonded or deposited on a carrier substrate wherein the carrier substrate is of quartz and the piezoelectric layer thickness is, e.g., smaller than four times the transducer electrode period and, in other embodiments, smaller than twice the transducer electrode period;

wherein the piezoelectric film is made of Lithium Tantalate (LiTaO$_3$) with an orientation between Y and Y+60 degrees;

wherein the piezoelectric film is made of Lithium Niobate (LiNbO$_3$) with an orientation between Y−20 degrees and Y+60 degrees;

wherein additional layers having a thickness smaller that the transducer electrode period are placed between the carrier substrate and the piezoelectric layer;

wherein at least one of the additional layers is made of Silicon Oxide;

wherein the piezoelectric layer is made by bonding a wafer of piezoelectric material on the carrier substrate and by grinding the piezoelectric material wafer in order to obtain a thin film;

wherein the piezoelectric layer is made by implanting ions in a piezoelectric material wafer in order to generate defects in the wafer at a given depth, by bonding this wafer to the carrier substrate, by splitting the piezoelectric material at the position of the defects, and by polishing the piezoelectric material;

wherein the carrier wafer is made of quartz and where the propagation direction of the transducer forms an angle smaller than 10 degrees with the axis z or −z of the quartz crystal;

wherein the piezoelectric layer is made of LiTaO$_3$ with an orientation between Y and Y+60 degrees and a propagation along X;

wherein the thickness of the piezoelectric layer is less than 60% of the electrode period of the transducer;

wherein the carrier substrate is quartz with its normal orientation along the x or y axis of the quartz; and wherein the carrier substrate is quartz with its normal forming an angle between 30 and 55 degrees with the x axis of the quartz;

wherein the LiTaO$_3$ layer thickness is between 20% and 40% the electrode period; and wherein the LiTaO$_3$ layer thickness is between 30% and 50% the electrode period; and wherein at least one resonator is implemented in a coupled resonator filter;

wherein the coupled resonator filter comprises at least two transducers placed between two gratings;

wherein at least one resonator element is incorporated in a ladder filter; wherein a filter using the cascade of the coupled resonator filter and at least one resonator connected in series or in parallel; and wherein at least one filter is incorporated into a duplexer.

Those skilled in the art will recognize improvements and modifications to the preferred embodiments of the present disclosure. All such improvements and modifications are considered within the scope of the concepts disclosed herein and the claims that follow.

What is claimed is:

1. A Surface Acoustic Wave (SAW) device, comprising:
a quartz carrier substrate;
a piezoelectric layer on a surface of the quartz carrier substrate; and
at least one interdigitated transducer on a surface of the piezoelectric layer opposite the quartz carrier substrate;
wherein a propagation direction of the at least one interdigitated transducer forms an angle less than 10 degrees with a z-axis or −z-axis of a quartz crystal of the quartz carrier substrate.

2. The SAW device of claim 1 wherein a thickness of the piezoelectric layer is less than four times a transducer electrode period of the at least one interdigitated transducer.

3. The SAW device of claim 1 wherein a thickness of the piezoelectric layer is less than twice a transducer electrode period of the at least one interdigitated transducer.

4. The SAW device of claim 1 wherein the SAW device comprises at least one SAW resonator.

5. The SAW device of claim 1 wherein the piezoelectric layer is formed of Lithium Tantalate with an orientation between Y and Y+60 degrees and a propagation along X.

6. The SAW device of claim 5 wherein a thickness of the piezoelectric layer is less than 60% of a transducer electrode period of the at least one interdigitated transducer.

7. The SAW device of claim 6 wherein a normal of the quartz carrier substrate is oriented along an x-axis or y-axis of the quartz crystal of the quartz carrier substrate.

8. The SAW device of claim 7 wherein the thickness of the piezoelectric layer is between 30% and 50% of the transducer electrode period of the at least one interdigitated transducer.

9. The SAW device of claim 6 wherein a normal of the quartz carrier substrate forms an angle between 30 and 55 degrees with an x-axis of the quartz crystal of the quartz carrier substrate.

10. The SAW device of claim 9 wherein the thickness of the piezoelectric layer is between 20% and 40% of the transducer electrode period of the at least one interdigitated transducer.

11. The SAW device of claim 1 wherein the piezoelectric layer is formed of Lithium Tantalate with an orientation between Y and Y+60 degrees.

12. The SAW device of claim 1 wherein the piezoelectric layer is formed of Lithium Niobate with an orientation between Y−20 degrees and Y+60 degrees.

13. The SAW device of claim 1 further comprising one or more additional layers on the surface of the quartz carrier substrate between the quartz carrier substrate and the piezoelectric layer.

14. The SAW device of claim 13 wherein the one or more additional layers comprise one or more dielectric layers.

15. The SAW device of claim 14 wherein the one or more dielectric layers comprise at least one layer of Silicon Oxide.

16. The SAW device of claim 1 wherein the at least one interdigitated transducer is embedded inside one or more dielectric layers.

17. The SAW device of claim 16 wherein the one or more dielectric layers comprise Silicon Oxide.

18. The SAW device of claim 1 further comprising one or more dielectric layers on a surface of the at least one interdigitated transducer opposite the piezoelectric layer.

19. The SAW device of claim 1 further comprising at least one layer of Silicon Oxide on the surface of the quartz carrier substrate between the quartz carrier substrate and the piezoelectric layer, wherein the at least one layer of Silicon Oxide is doped to reduce its thermal sensitivity.

20. The SAW device of claim 19 wherein the at least one layer of Silicon Oxide is doped with a dopant containing Fluoride or Boron atoms.

21. Filtering circuitry comprising:
a Surface Acoustic Wave (SAW) resonator comprising:
a quartz carrier substrate;
a piezoelectric layer on a surface of the quartz carrier substrate; and
at least one interdigitated transducer on a surface of the piezoelectric layer opposite the quartz carrier substrate;
wherein a propagation direction of the at least one interdigitated transducer forms an angle less than 10 degrees with a z-axis or −z-axis of a quartz crystal of the quartz carrier substrate.

22. A method of fabricating a Surface Acoustic Wave (SAW) device, comprising:
providing a quartz carrier substrate;
providing a piezoelectric layer on a surface of the quartz carrier substrate; and
providing at least one interdigitated transducer on a surface of the piezoelectric layer opposite the quartz carrier substrate;
wherein a propagation direction of the at least one interdigitated transducer forms an angle less than 10 degrees with a z-axis or −z-axis of a quartz crystal of the quartz carrier substrate.

23. A Surface Acoustic Wave (SAW) device, comprising:
a quartz carrier substrate;
a piezoelectric layer on a surface of the quartz carrier substrate; and
at least one interdigitated transducer on a surface of the piezoelectric layer opposite the quartz carrier substrate;
wherein a crystallographic x-axis of the piezoelectric layer is aligned with a crystallographic z-axis of the quartz carrier substrate.

24. The SAW device of claim 23 wherein the piezoelectric layer is formed of Lithium Niobate or Lithium Tantalate.

25. The SAW device of claim 23 wherein a bulk cutoff frequency in the quartz carrier substrate is higher than a resonance frequency of the SAW device.

* * * * *

UNITED STATES PATENT AND TRADEMARK OFFICE
CERTIFICATE OF CORRECTION

PATENT NO. : 10,084,427 B2
APPLICATION NO. : 15/086895
DATED : September 25, 2018
INVENTOR(S) : Marc Solal and Shogo Inoue Page 1 of 1

It is certified that error appears in the above-identified patent and that said Letters Patent is hereby corrected as shown below:

In the Specification

In Column 8, Line 56, replace "(hereinafter "Sola")" with --(hereinafter "Solal")--.

In Column 10, Line 57, replace "the thickness ($t_{piezo}$) f the" with --the thickness ($t_{piezo}$) of the--.

In Column 11, Lines 1, 5, and 15, replace "than 2 p" with --than 2p--.

In Column 12, Line 24, replace "frequency is Vs/2 p," with --frequency is Vs/2p,--.

Signed and Sealed this
Thirtieth Day of October, 2018

Andrei Iancu
*Director of the United States Patent and Trademark Office*